US00RE48275E

(19) United States
(12) Reissued Patent
Caffee et al.

(10) Patent Number: US RE48,275 E
(45) Date of Reissued Patent: Oct. 20, 2020

(54) DIGITAL-TO-TIME CONVERTER

(71) Applicant: Silicon Laboratories Inc., Austin, TX (US)

(72) Inventors: Aaron J. Caffee, Scappoose, OR (US); Brian G. Drost, Corvallis, OR (US)

(73) Assignee: Silicon Laboratories Inc., Austin, TX (US)

(21) Appl. No.: 15/217,364

(22) Filed: Jul. 22, 2016

Related U.S. Patent Documents

Reissue of:
(64) Patent No.: 9,362,936
Issued: Jun. 7, 2016
Appl. No.: 14/745,534
Filed: Jun. 22, 2015

(51) Int. Cl.
*H03K 5/135* (2006.01)
*H03M 1/82* (2006.01)

(52) U.S. Cl.
CPC ..... *H03K 5/135* (2013.01); *H03M 1/82* (2013.01)

(58) Field of Classification Search
CPC ..... H03L 7/00; H03L 7/02; H03L 7/06; H03L 7/08; H03L 7/0805; H03L 7/0814; H03L 7/087; H03L 7/089; H03L 7/091; H03L 7/097; H03L 7/103; H03L 7/18; H03L 1/02; H03M 1/1033; H03M 1/0836; H03M 1/82; H03B 19/00; H03K 5/135; H03K 5/13; H03K 5/00
See application file for complete search history.

(56) References Cited

U.S. PATENT DOCUMENTS 3,676,661 A 7/1972 Sprowl
4,584,489 A 4/1986 Tanaka
5,659,314 A 8/1997 Tokura
7,417,510 B2 * 8/2008 Huang ..... H03K 5/1565 327/117
8,283,933 B2 10/2012 Dasnurkar
8,462,840 B2 * 6/2013 Chen ..... H03M 1/661 375/239
8,503,597 B2 * 8/2013 Fischette ..... H03D 3/24 375/375
8,531,246 B2 9/2013 Huang
8,669,810 B2 * 3/2014 Kwon ..... G06F 10/005 330/252
8,692,599 B2 4/2014 Gong et al.
8,736,476 B2 5/2014 Gong et al.
8,994,573 B2 3/2015 Henzler
9,007,251 B2 * 4/2015 Perthold ..... G01R 23/16 341/118

(Continued)

OTHER PUBLICATIONS

Ru, J., et al., "A High-Linearity Digital-to-Time Converter Technique: Constant-Slope Charging," IEEE Journal of Solid-State Circuits, vol. 50, No. 6, Jun. 2015, pp. 1412-1423.

(Continued)

*Primary Examiner* — Samuel G Rimell
(74) *Attorney, Agent, or Firm* — Zagorin Cave LLP

(57) ABSTRACT

A digital-to-time converter includes a first node, a second node configured to receive a reference signal, and a digital-to-analog signal converter configured to couple a passive impedance to the first node. The passive impedance is selected according to the digital code. The digital-to-time converter also includes a first switch configured to selectively couple the first node to a second reference signal in response to the input signal and a comparator configured to generate the output signal based on a first signal on the first node and the reference signal on the second node. The digital-to-time converter may include a second switch configured to selectively couple the first node to a third reference signal in response to a first control signal.

19 Claims, 14 Drawing Sheets

(56) References Cited

U.S. PATENT DOCUMENTS

| | | | | |
|---|---|---|---|---|
| 9,071,304 | B2 | 6/2015 | Banin | |
| 9,137,084 | B2 * | 9/2015 | Degani | H04L 27/36 |
| 9,209,958 | B1 | 12/2015 | Palaskas | |
| 9,362,936 | B1 * | 6/2016 | Caffee | H03K 5/135 |
| 2004/0174286 | A1 | 9/2004 | Donovan | |
| 2011/0156783 | A1 | 6/2011 | Pavlovic | |
| 2014/0002288 | A1 | 1/2014 | Scholz | |
| 2014/0176201 | A1 | 6/2014 | Weltin-Wu | |
| 2015/0145567 | A1 | 5/2015 | Perrott | |
| 2015/0145569 | A1 | 5/2015 | Perrott | |
| 2015/0145570 | A1 | 5/2015 | Perrott | |
| 2015/0145571 | A1 | 5/2015 | Perrott | |

OTHER PUBLICATIONS

Alahdab, S. et al., "A 12-Bit Digital-to-Time Converter (DTC) with sub-ps-level resolution using current DAC and differential switch for Time-to-Digital Converter (TDC)," IEEE International Instrumentation and Measurement Technology Conference (I2MTC), May 13-16, 2012, pp. 2668-2671.

* cited by examiner

DIGITAL-TO-TIME CONVERTER

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

BACKGROUND

1. Field of the Invention

The present invention is related to data converters and more particularly to digital-to-analog converters.

2. Description of the Related Art

In general, a digital-to-time converter is a digital-to-analog data converter that generates an output signal having a period or edge delay based on a digital control word and a reference clock signal. For example, a clock divider circuit is a digital-to-time period converter that generates an output clock signal based on a reference clock signal and a digital control word indicating a divide ratio (e.g. an integer divide ratio or a fractional divide ratio). The analog output is the period of the output clock signal. The output clock period is based on the digital control word and the clock period of the reference clock signal. The output clock signal has a digitally-defined, full-scale range and a least-significant bit clock period.

A typical integer clock frequency divider is a digital-to-time period converter that generates an output clock signal having a period based on an integer multiplication of the input clock period and has a static and bounded quantization error and random jitter based on thermal noise. The fractional clock frequency divider is a dithering modulus clock frequency divider generating output clock signals having an average output clock period that is based on a fractional multiplication of the input clock period. A particular digital control word has an integer portion and a fractional portion. The dithering modulus clock divider provides a noise-shaped integer control signal to an integer clock divider that receives a reference clock signal. The noise-shaped integer control signal dithers between integer clock divider values causing the integer divider to generate an output clock signal having a period that, on average, is the target fractional clock period. The analog quantization error of the dithering noise-shaped integer control signal causes substantial deterministic jitter that dominates the jitter performance.

Digital-to-time period converters are used in clock synthesizer applications. Integer-based PLLs have been used extensively in clock multiplication applications that demand superior spurious performance. In order to generate fractional output frequencies, a prescaler digital-to-time converter (DivP) is used in the reference path of the PLL while a separate digital-to-time converter is used in the feedback path (DivN). In this way, the reference clock frequency can be multiplied by N/P. While this technique has proved useful in industry, the frequency resolution supported by the clock multiplier directly constrains the maximum achievable bandwidth to about $f_{ref}/(10\times P)$. As a result, the system is more dependent on voltage-controlled oscillator phase noise performance which can often translate into higher power consumption. In addition, the low loop bandwidth of the clock synthesizer reduces its usefulness in data communication applications to supporting significantly lower data rates than might otherwise be desired.

Referring to FIG. 1, an exemplary clock synthesizer utilizes phase-locked loop (PLL) 100, which includes a phase/frequency detector 102, a charge pump loop filter 104, and a voltage-controlled oscillator (VCO) 106. Voltage controlled oscillator 106 may be implemented as a ring oscillator, an LC oscillator, or other suitable oscillator structure. Phase/frequency detector 102 receives reference clock signal $ck_{in}$, which may be provided by a fixed source, such as a crystal oscillator, a microelectromechanical structure (MEMS) oscillator, or other suitable source. Fractional divider 108 introduces a digital quantization error that causes phase noise (i.e., jitter) in the feedback clock signal, $ck_{fb}$. For example, $ck_{fb}$ may have jitter of up to one cycle of the VCO output $ck_{vco}$.

A reference signal having a frequency $f_{in}$ supplied to PLL 100 is multiplied based on a divider value to generate a synthesized clock signal $ck_{vco}$. Frequency $f_{out}$ of the output clock signal, $ck_{out}$, can be determined by a divider value $D_{fb}$ of the feedback divider in the PLL, and in embodiments including output divider 110, a divider value $D_{out}$ of output divider 110:

$$f_{out} = f_{in}\frac{D_{fb}}{D_{out}}.$$

The feedback divider includes a digital-to-time converter that may be a fractional-N feedback divider 108 that receives clock signal $ck_{vco}$ as the reference clock signal and digital control word $D_{fb}$. Digital control word $D_{fb}$ is a divide value sequence of integers corresponding to a target fractional divider ratio. The synthesized clock signal $ck_{vco}$ may be further divided by an output divider, which may be an integer clock divider including a digital-to-time period converter that generates the output clock signal $ck_{out}$ based on clock signal $ck_{vco}$ as the reference clock signal and integer divide value $D_{out}$. In applications with demanding spur specifications, another integer clock divider (not shown) receives an input clock and a divide value $D_{in}$ and generates reference clock signal $ck_{in}$ provided to phase frequency detector 102. Note that in such embodiments an integer clock divider may be used instead of fractional divider 108 and $D_{in}$, $D_{fb}$, and $D_{out}$ have integer values to generate output clock signal $ck_{out}$ a signal having a frequency:

$$f_{out} = f_{in}\frac{D_{fb}}{D_{in}D_{out}}.$$

However, an input integer divider provides frequency resolution at the expense of phase noise. Using a fractional-based digital word for $D_{fb}$ and fractional divider 108 instead of an integer input divider and an integer feedback divider, supports higher output frequency resolution. The PLL behaves like a digital-to-analog converter reconstruction filter and reduces or eliminates high-frequency quantization noise. The higher PLL bandwidths improve VCO noise suppression but introduce deterministic jitter.

As the frequencies of $ck_{in}$ and $ck_{out}$ increase, the target clock period decreases and jitter introduced by the digital-to-time converter circuits become a larger fraction of the target clock period, thereby causing output clock signals from conventional clock synthesizer designs to fail to meet target performance specifications. Accordingly, improved techniques for digital-to-time conversion are desired.

SUMMARY OF EMBODIMENTS OF THE INVENTION

In at least one embodiment of the invention, an apparatus includes a digital-to-time converter. The digital-to-time converter includes a first node, a second node configured to receive a reference signal, and a digital-to-analog signal converter configured to couple a passive impedance to the first node. The passive impedance is selected according to the digital code. The digital-to-time converter also includes a first switch configured to selectively couple the first node to a second reference signal in response to an input signal and a comparator configured to generate the output signal based on a first signal on the first node and the reference signal on the second node. Edges of the output signal may correspond to the input signal edges linearly delayed based on the digital code. The digital-to-time converter may include a second switch configured to selectively couple the first node to a third reference signal in response to a first control signal. The first node may be charged to a reset voltage level in response to the first control signal closing the second switch. The first node may be charged to a pedestal voltage level according to the passive impedance and in response to the first and second switches being open. The digital-to-analog signal converter may introduce a pedestal voltage to the first node after a reset phase. An active phase of a first control signal may couple the first node to the second reference signal, causing the first node to charge to a first voltage level. An active phase of the input signal may couple the first node to the reference signal, causing the first node to charge to a second voltage level, the second voltage level being greater than a voltage level on the second node, and the voltage level on the second node being greater than the first voltage level. The digital-to-analog signal converter may include a plurality of elements configured to receive the digital code. The digital code may have a plurality of bits. Each of the plurality of elements may include an inverter configured to receive a corresponding bit of the plurality of bits and a capacitor coupled in series between the inverter and the first node. The input signal and the digital code may be generated by a frequency divider according to a divide code and a reference clock signal. The input signal may be a frequency-divided version of the reference clock signal and the digital code may be an associated digital quantization error. The digital-to-time converter may be configured as a subrange data converter with respect to an integer frequency divider configured to generate the input signal and the digital code based on an input clock signal and a digital divider code. The digital-to-time converter may be configured to sample-and-hold the input signal in a time-to-digital signal converter. The digital-to-time converter may be included in an output path of a clock synthesizer circuit. The circuit may be included in a feedback loop of a phase-locked loop.

In at least one embodiment of the invention, a method includes establishing a first voltage level on a first node. The method includes changing the voltage on the first node from the first voltage level to a second voltage level according to a digital code and at a predetermined slew rate. A switching threshold voltage level is between the first voltage level and the second voltage level. The method includes generating an output voltage signal based on a comparison of the voltage on the first node to the switching threshold voltage level. The output signal has an edge delayed from a corresponding edge of an input signal based on the digital code. Establishing the first voltage level may include selectively coupling the first node to a reset voltage having the first voltage level. Changing the voltage may include changing the voltage on the first node from the first voltage level to a second voltage level according to the digital code and changing the voltage on the first node from the second voltage level to a third voltage level in response to the input signal. Changing the voltage on the first node may include generating a current by selectively opening and closing a switch coupled to a switched capacitor resistor at a predetermined frequency. The method may include generating the input signal and the digital code based on a reference clock signal and a digital divider code. The method may include calibrating a gain of the digital-to-time delay conversion signal based on the output signal and a delayed version of the input signal.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

A technique that reduces control voltage ripple without narrowing the bandwidth of the PLL in a clock synthesizer uses a time-domain digital-to-analog converter (i.e., digital-to-time converter) in series with a dynamic feedback divider. Similar to the current-mode phase interpolation technique, the time-domain digital-to-analog converter receives an error residue that attempts to adjust for phase errors introduced by the dynamic feedback divider. This approach addresses the phase error early in the signal path, causes the downstream phase detector and associated charge pump loop filter circuitry of the PLL to see a much smaller signal, and as a result, operate more linearly than other implementations.

Figure 1:
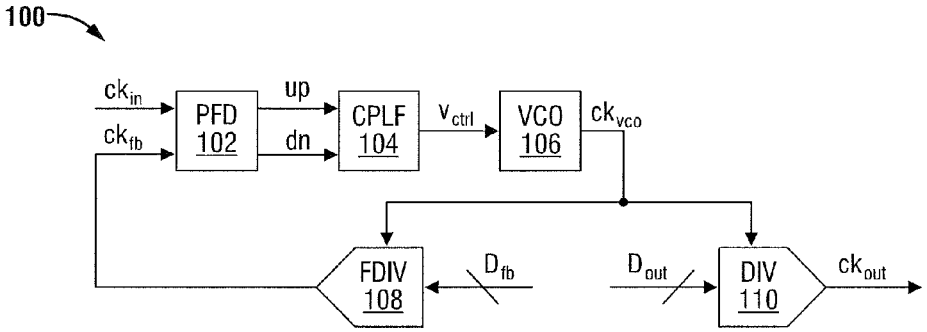
FIG. 1 illustrates a functional block diagram of an exemplary system for generating a clock signal using fractional frequency synthesis.
Figure 2:
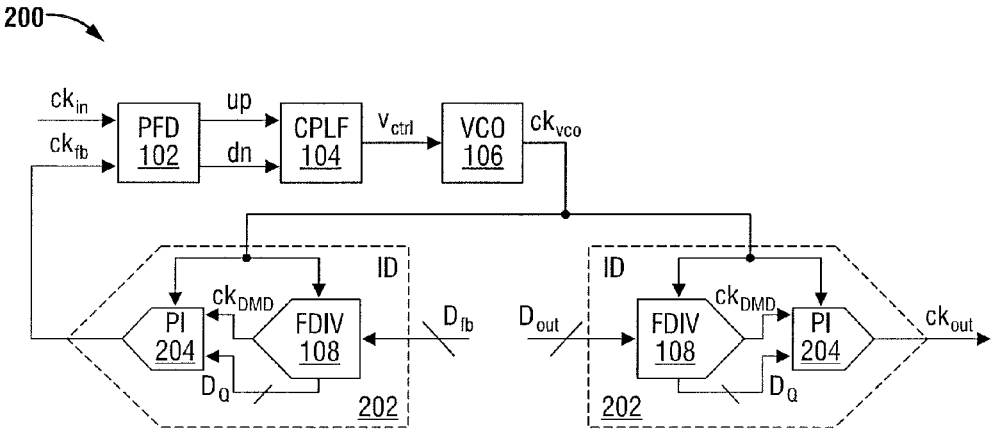
FIG. 2 illustrates a functional block diagram of an exemplary system for generating a clock signal using an interpolative divider.

Referring to FIGS. 1 and 2, a technique for reducing jitter in PLL 100 includes delay-based quantization noise cancellation. The technique includes adjusting the phase of the frequency-divided signal at the output of a fractional divider, according to an error control signal $D_Q$, generated by fractional divider 108. The technique applies the error control signal $D_Q$ to phase interpolator 204 and performs the subtraction in the time domain. Accordingly, any linearity requirement imposed by the quantization noise cancellation is limited to phase interpolator 204. This technique reduces phase errors seen by the front-end of PLL 200 (e.g., phase detector 102) as compared to the phase errors seen by the front-end of PLL 100. In addition, ratio-metric techniques may be used to reduce phase interpolator gain error. Moreover, the delay-based quantization noise compensation is easily adapted to output divider configurations. Interpolative divider techniques for reducing noise associated with a fractional-N divider are described in U.S. Pat. No. 7,417,510, filed Oct. 17, 2006, entitled "Direct Digital Interpolative Synthesis," naming Yunteng Huang as inventor, which application is hereby incorporated by reference.

Referring to FIG. 2, interpolative divider 202 includes fractional divider 108 and phase interpolator 204. Fractional divider 108 may include a dithering modulus divider (e.g., a typical first order sigma-delta modulator or higher-order sigma-delta modulator) that generates noise-shaped clock signal $ck_{DMD}$ and digital quantization error signal $D_Q$. Phase interpolator 204 adjusts the phase of clock signal $ck_{DMD}$ according to the digital quantization error signal to reduce error in the feedback clock signal $ck_{fb}$, thereby introducing a phase adjustment prior to phase/frequency detector 102 of PLL 200. Interpolative divider 202 is a sub-ranging digital-to-time period converter that generates an output signal with an average fractional period resolution. Phase interpolator 204 is a digital-to-time converter that uses digital quantization error signal $D_Q$ to divide output quantization noise by up to $2^{N_{frac}}$, depending on $N_{PI}$ with respect to $N_{frac}$, where $N_{PI}$ is the number of bits by which phase interpolator 204 reduces the quantization noise, $N_{frac}$ is the number of bits used to represent the fractional portion of the divide ratio, i.e., the fractional portion bit-width and $N_{PI}$ is less than or equal to $N_{frac}$. Error of phase interpolator 204 limits the resolution of the digital-to-analog conversion of interpolative divider 202.

Figure 3:
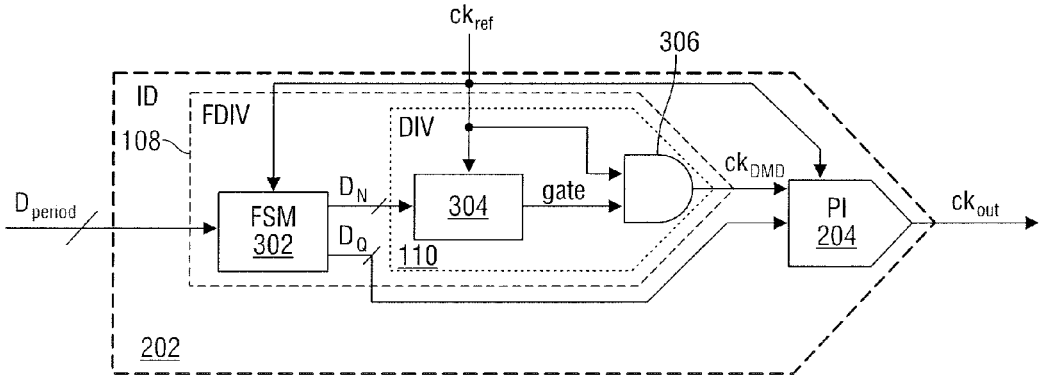
FIG. 3 illustrates a functional block diagram of an exemplary interpolative divider of FIG. 2.

Referring to FIG. 3, in at least one embodiment, fractional divider 108 of interpolative divider 202 includes finite-state machine 302 that generates digital code $D_N$, which dithers between different divide values, and an associated digital quantization error signal $D_Q$. Counter 304 generates a gating signal that is used to select and stretch pulses of clock signal $ck_{ref}$ (e.g., by digitally gating clock signal $ck_{ref}$ with the gating signal using AND-gate 306 or other suitable logic circuit) to generate clock signal $ck_{DMD}$.

Ideally, the phase interpolator transfer function, i.e., the output time delay as a function of digital quantization error signal $D_Q$, is:

$$T_{PI}(D_Q)=T_{PI,DAC}T_{PI,OS}$$

where $$T_{PI,DAC}=\frac{T_{ref}}{2^N PI}D_Q,$$

and $T_{PI,OS}$ is an output delay offset. The output delay offset is not a function of digital quantization error signal $D_Q$, but rather is affected by environmental factors, and may be assumed to be zero with respect to deterministic jitter. The full-scale range of the phase interpolator delay is ideally one dithering modulus divider bit, i.e., one least-significant bit of digital code $D_N$, which corresponds to reference clock period $T_{ref}$, which is one period of reference clock $ck_{ref}$. For example, for a two-bit phase interpolator, digital quantization error signal $D_Q$ may have values 00, 01, 10, and 11, which correspond to discrete $T_{PI,DAC}$ values of 0, $T_{ref}/4$, $2\times T_{ref}/4$, and $3\times T_{ref}/4$. A delay of $4\times T_{ref}/4$ corresponds to an entire period of reference clock signal $ck_{ref}$, i.e., reference clock period $T_{ref}$. The phase interpolator error includes difference in phase interpolator output from the expected discrete $T_{PI,DAC}$ values. The component of phase interpolator error that is linearly related to digital quantization error signal $D_Q$ is referred to as gain error and a component of phase interpolator error that is randomly related to digital quantization error signal $D_Q$ is referred to as mismatch error. In addition, higher order gain error may be present (e.g., systematic non-linearities). Both gain error and mismatch error affect peak-to-peak deterministic jitter.

Figure 4:
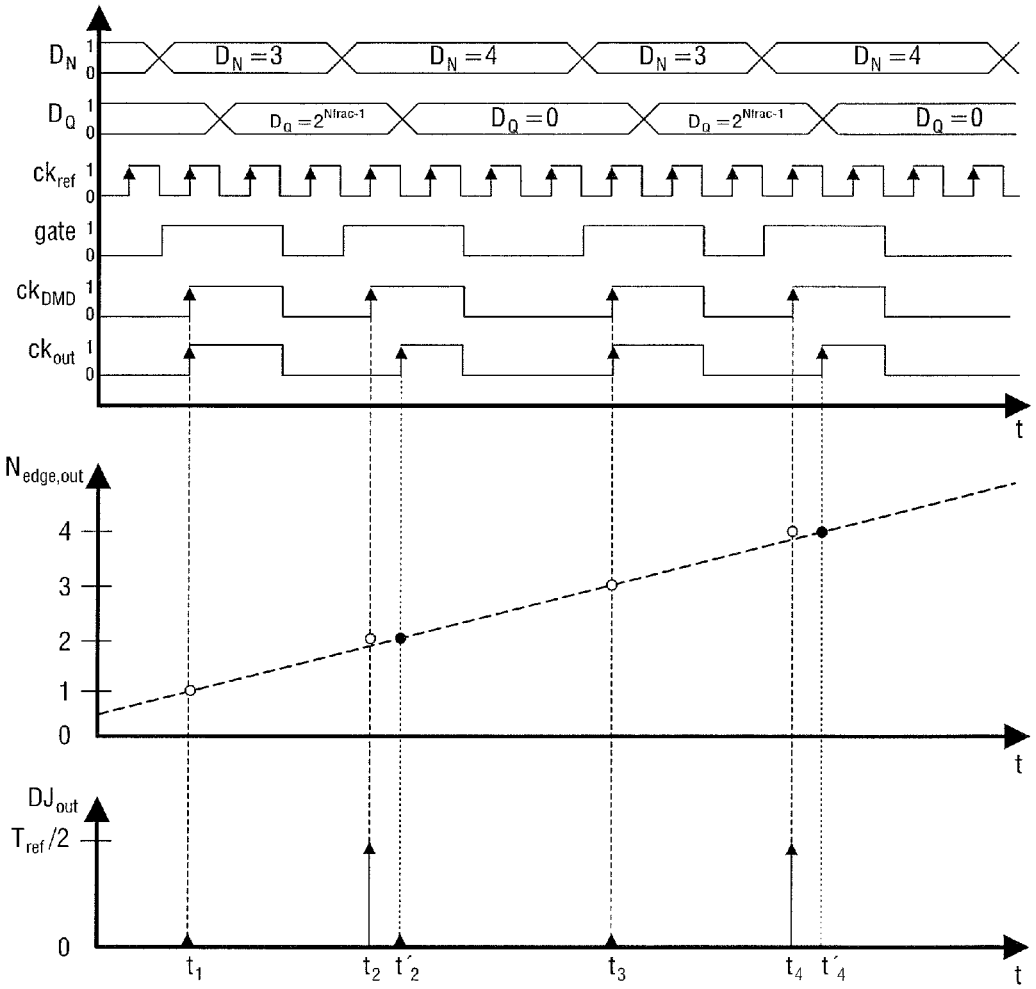
FIG. 4 illustrates timing waveforms for the exemplary interpolative divider of FIG. 3.

Referring to FIGS. 3 and 4, for an exemplary fractional divide ratio of 3.5, $D_{period}=(11.10)_2$, the noise-shaped integer divider value, digital code $D_N$ dithers between 3 and 4 and the digital quantization error signal $D_Q$ dithers between $2^{N_{frac}-1}$ and 0. Integer divider 110 generates clock signal $ck_{DMD}$ that has a period of three times the period of reference clock signal $ck_{ref}$ when digital code $D_N=3$ (e.g., between time $t_1$ and $t_2$) and has a period of four times the period of reference clock signal $ck_{ref}$ when digital code $D_N=4$ (e.g., between times $t_2$ and $t_3$). Then, phase interpolator 204 delays the edge of clock signal $ck_{DMD}$ according to the digital quantization error signal to generate output clock signal $ck_{out}$, having a period that is 3.5 times the period of reference clock signal $ck_{ref}$. Note that the period between times $t_1$, and $t'_2$, the period between times $t'_2$ and $t_3$, and the period between times $t_3$ and $t'_4$ is 3.5 times the period of reference clock signal $ck_{ref}$. However, the output duty cycle of output clock signal $ck_{out}$ is not 50%. In at least one embodiment, a divide by two may be used to generate an output signal having a 50% output duty cycle. The deterministic jitter of clock signal $ck_{DMD}$ at $t_2$ and $t_4$ is half of reference clock period, $T_{ref}/2$ and is cancelled by phase interpolator 204.

Figure 5:
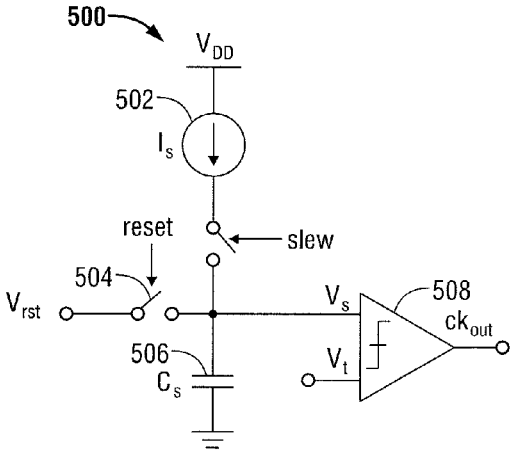
FIG. 5 illustrates a circuit diagram of a digital-to-time converter cell of an exemplary phase interpolator of FIG. 3.
Figure 6:
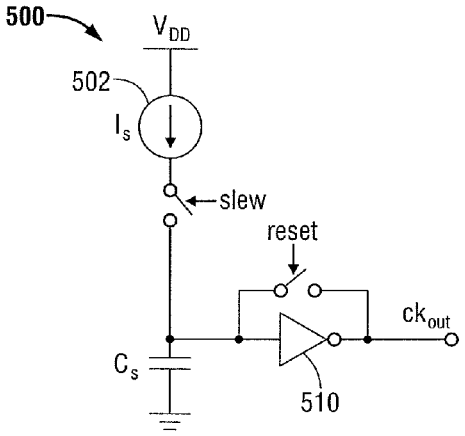
FIG. 6 illustrates a circuit diagram of a digital-to-time converter cell of an exemplary phase interpolator of FIG. 3.
Figure 7:
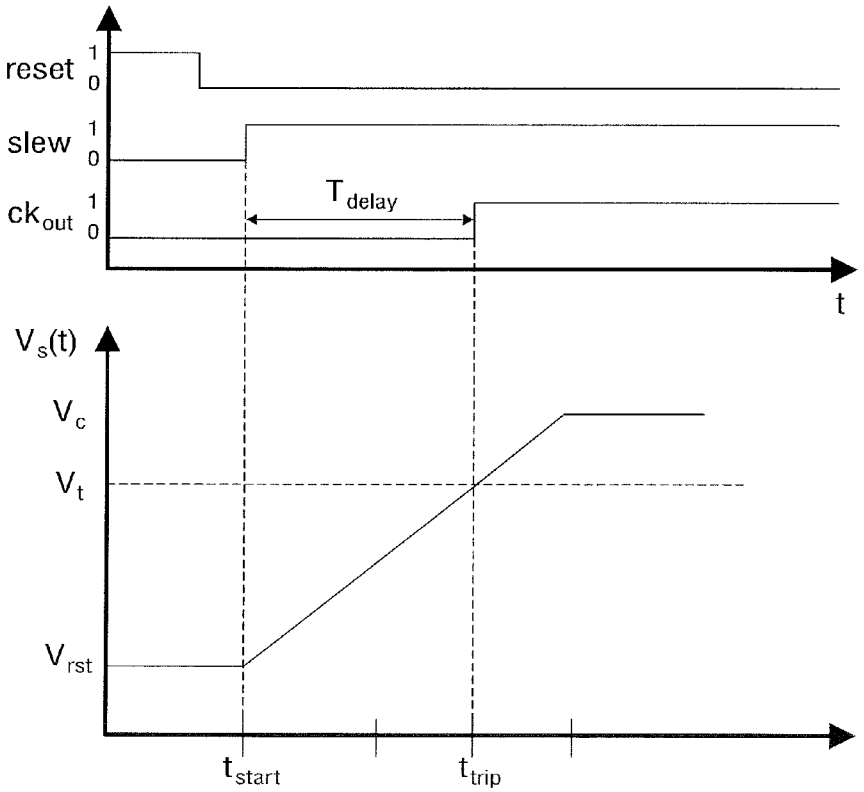
FIG. 7 illustrates timing waveforms for the exemplary digital-to-time converter cell of FIG. 5.

As discussed above, a typical phase interpolator circuit is a digital-to-time converter that delays an input edge signal to generate an output edge signal based on an analog reference signal (e.g., a voltage, current) and digital control word $D_Q$ indicating the amount of delay to be applied. The full-scale range and least significant bit delay tend to be determined by analog components. Referring to FIGS. 5 and 7, in typical unit cell 500 of a digital-to-time converter, in response to a reset control signal, capacitor $C_s$ is coupled to reference voltage $V_{rst}$ to store an initial charge on capacitor $C_s$, which resets the voltage on node $V_s$ to the level of reference voltage $V_{rst}$. In response to the reset signal being deasserted and a slew control signal being asserted, the charge stored by capacitor $C_s$ increases by charge delivered from current source $I_s$. When the voltage on node $V_s$ reaches trip voltage $V_t$ of comparator 508, at time $t_{trip}$, the comparator output signal transitions, e.g., from low to high, generating a rising edge of $ck_{out}$. The time that it takes for node $V_s$ to charge from reference voltage $V_{rst}$ to trip voltage $V_t$ is time delay $T_{delay}$. Note that comparator delay $T_{comp}$ ideally has no dependence on the control code and introduces negligible deterministic jitter. Time delay $T_{delay}$ of delay cell 500 is typically controlled by adjusting the slew rate of the voltage on node $V_s$. Referring to FIG. 6, in at least one embodiment, delay cell 500 includes an inverter-based comparator and the reference voltage is derived from the trip-point of inverter 510 and no additional trip voltage is needed. Note that since low frequency noise affects charge stored on capacitor $C_s$, an auto-zeroing technique (e.g., correlated double sampling) is used to effectively reduce or eliminate flicker noise.

Figure 8:
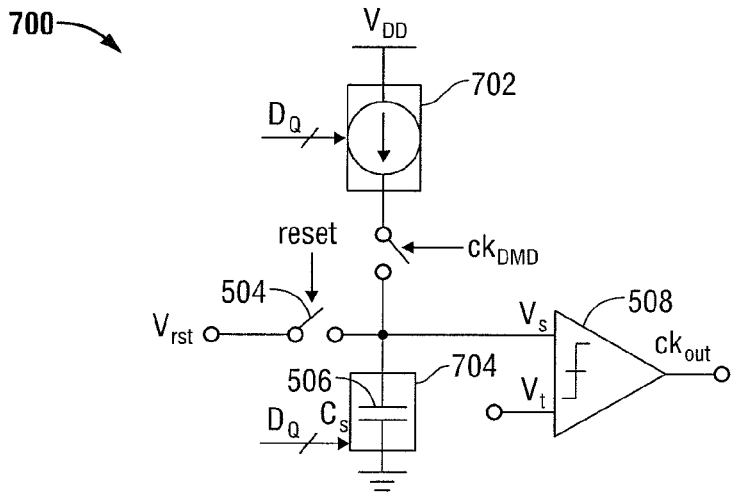
FIG. 8 illustrates a circuit diagram of an exemplary slew rate based delay control digital-to-time converter cell.
Figure 9:
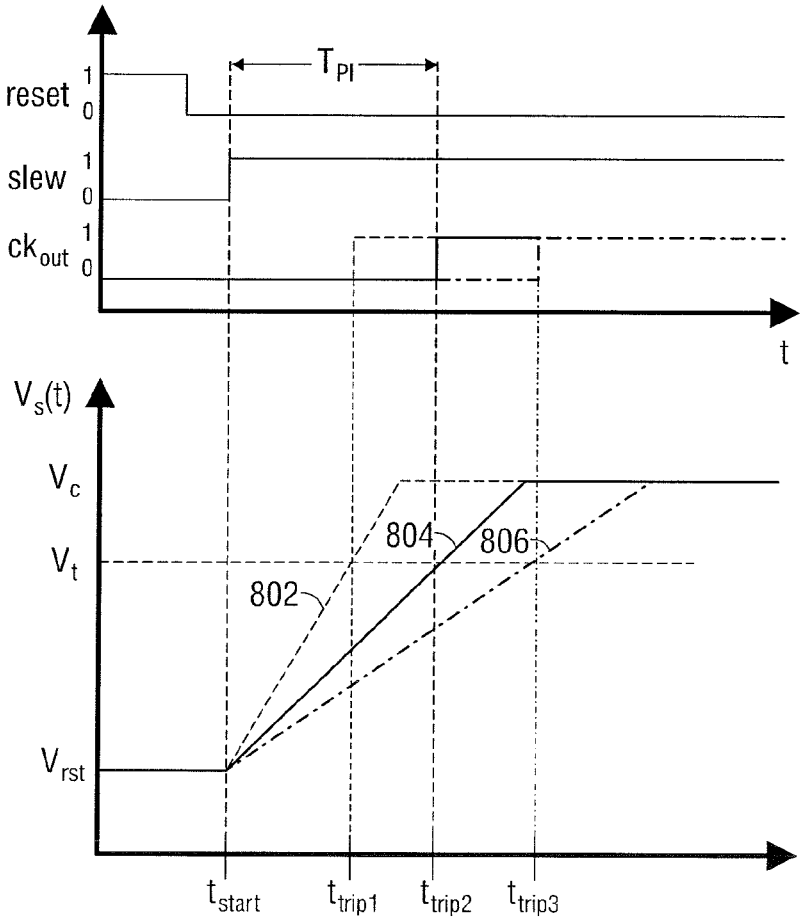
FIG. 9 illustrates timing waveforms for the exemplary slew rate based delay control digital-to-time converter cell of FIG. 8.

Referring to FIGS. 8 and 9, the slew rate of the voltage on node $V_s$ of unit cell 700 of a digital-to-time converter may be changed by selectively adjusting one or more of the current output by current source 702 or the capacitance $C_s$ of capacitor 704. When controlling the current provided by current source 702 based on digital control word $D_Q$, individual current sources $I_{LSB}$ may be enabled to obtain:

$$T_{PI}(D_Q)=\frac{C_S}{I_S}(V_t-V_{rst})+T_{comp}=\frac{C_S}{D_Q I_{LSB}}(V_t-V_{rst})+T_{comp}.$$

Note that in this case, time delay $T_{PI}$ is a non-linear function of digital control word $D_Q$. For the greatest value of digital control word $D_Q$, the slew rate is the fastest, the trip voltage is reached soonest, at time $t_{trip1}$, and the delay of the rising clock edge of $ck_{out}$ is the smallest, as illustrated by $V_s(t)$ curve 802. For the smallest value of digital control word $D_Q$, the slew rate is the slowest, the trip voltage is reached latest at time $t_{trip3}$ and the delay of the rising clock edge of output clock signal $ck_{out}$ is the greatest, as illustrated by $V_s(t)$ curve 806. The code-dependent slew rate results in a complex gain variability that may be difficult to calibrate. Controlling the slew rate using selectively enabled current sources, in particular, is susceptible to substantial random mismatch due to use of active devices, and trades off deterministic jitter with random jitter.

When controlling slew rate by varying target capacitance $C_s$, individual capacitors $C_{LSB}$ may be selectively coupled via switches to obtain the target capacitance $C_s$ and thus a target delay period:

$$T_{PI}(D_Q) = \frac{C_S}{I_S}(V_t - V_{rst}) + T_{comp} = \frac{D_Q C_{LSB}}{I_S}(V_t - V_{rst}) + T_{comp}.$$

Note that $T_{PI}(D_Q)$ is a linear function of digital control word $D_Q$.

However, variable slew rate affects the delay of the voltage comparator that receives signals from this node and, ultimately, causes nonlinearity in the delay control. While nonlinearity of a digital-to-time converter may be acceptable in some applications, other applications, such as frequency synthesis, are not as tolerant. Therefore, it is desirable to eliminate variable slew rate as a source of error. Although trim at production test can reduce or eliminate gain error at a particular temperature and age, variation over temperature and age will ultimately degrade performance. Accordingly, high performance applications require active gain error calibration, which substantially increases complexity.

Rather than use a variable slew rate delay cell, a digital-to-time converter includes a fixed slew rate delay cell. It is desirable to maintain a constant slew rate as an input node passes through a trip point of the voltage comparator. By changing the initial voltage, $V_{initial}$, on a fixed capacitor, $C_{slew}$, and then initiating slewing with a constant current, Islew, a variable delay element whose delay depends on $$\frac{V_{initial} \times C_{slew}}{I_{slew}}$$

is formed. If this initial voltage level is sufficiently far away from the comparator trip point voltage level, then the digital-to-time converter should have minimal modulation of comparator delay and, therefore, a more linear delay versus control characteristic. Various different techniques may be used to realize the initial capacitor voltage. An exemplary digital approach uses a capacitor digital-to-analog converter. In addition, by deriving the slewing current from a voltage-to-current generator loaded by a switched-capacitor resistor, a difference in delay between digital-to-analog converter codes will be ratio-metric to capacitance. Furthermore, a current generator that uses a voltage that is proportional to the voltage reference used by the capacitor digital-to-analog converter causes the difference in delay between digital-to-analog converter codes to be ratio-metric in voltage and proportional to the frequency used to drive the switched-capacitor resistor. Thus, the difference in delay between any two digital-to-analog converter codes will, using ideal elements, be directly proportional to the difference in codes used. Note that conversion gain from voltage-to-time delay may also be trimmed by adjusting the capacitance and/or voltage ratio. Other noise-shaping techniques such as chopping, auto-zeroing, delta-sigma modulation, dynamic element matching (either white or high-pass noise-shaped), and current-copier mirroring techniques may be used to further improve upon the accuracy of the design depending on the application.

Figure 10:
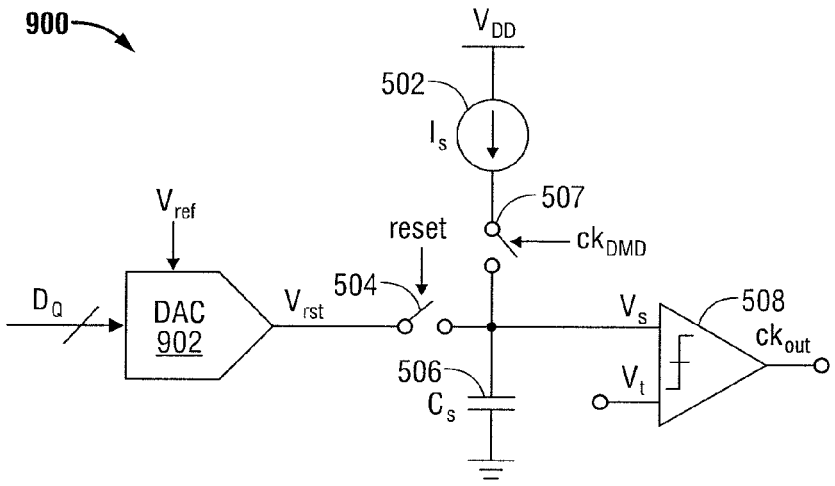
FIG. 10 illustrates a circuit diagram of an exemplary reset voltage based delay control digital-to-time converter cell consistent with at least one embodiment of the invention.
Figure 11:
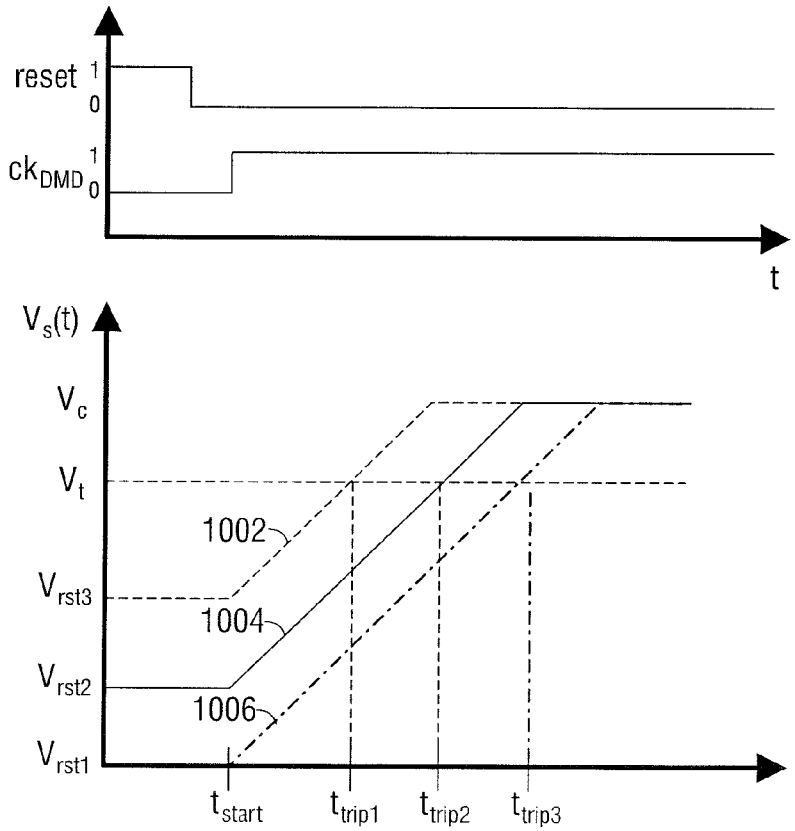
FIG. 11 illustrates timing waveforms for the exemplary reset voltage based delay control digital-to-time converter of FIG. 10.

Referring to FIGS. 10 and 11, digital-to-time converter 900 includes constant current source 502, which provides constant current $I_S$, and predetermined capacitor 506, which provides constant capacitance $C_S$. Digital-to-time converter 900 is configured to generate a selectively controllable reset voltage, $V_{rst}$ based on a digital control word $D_Q$ and reference voltage $V_{ref}$. During a first time interval, e.g., the time interval during which the reset control signal closes switch 504 and evaluate control signal $ck_{DMD}$ opens switch 507, digital-to-time converter 900 applies reset voltage $V_{rst}$ to charge fixed capacitor $C_S$ to a level determined according to a particular reset voltage level selected based on digital control word $D_Q$. Note that the digital control word $D_Q$ may include multiple bits having digital voltage levels that are thermometer coded, binary coded, or coded using other suitable techniques. During a second time interval, switch 504 is open according to the reset control signal and switch 507 is closed according to clock signal $ck_{DMD}$. Digital-to-time converter 900 applies the constant current generated by current source 502 to node $V_s$, causing the voltage level on node $V_s$ to increase from the selected reset voltage level to a second level, $V_c$, with linear delay control, as illustrated by $V_s(t)$ curves 1002, 1004, and 1006 for increasing digital control word $D_Q$ and decreasing $V_{rst}$. The resulting phase interpolator delay is:

$$T_{PI}(D_Q) = \frac{C_S}{I_S}(V_t - V_{rst}) + T_{comp} = \frac{C_S}{I_S}V_t + T_{comp} - \frac{C_S}{I_S}\frac{V_{rst}}{2^N PI}D_Q,$$

where $$T_{PI,OS} = \frac{C_S}{I_S}V_t + T_{comp} \text{ and } T_{PI,DAC} = -\frac{C_S}{I_S}\frac{V_{rst}}{2^N PI}D_Q.$$

Digital-to-analog converter 902 of digital-to-time converter 900 may include passive elements (e.g., resistors and capacitors) that are easily matched by manufacturing techniques. In at least one embodiment, digital-to-time converter 900 includes only one current source and one slew control switch, which reduces or eliminates code-dependent switching errors. Digital-to-time converter 900 includes comparator 508 having a simple, fixed, code-independent delay. However, the code-dependent reset charge injection of digital-to-time converter 900 may cause complex gain and non-linear current variations.

Figure 12:
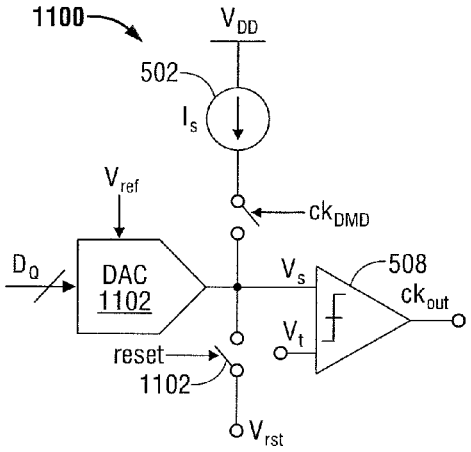
FIG. 12 illustrates a circuit diagram of an exemplary pedestal voltage based delay control digital-to-time converter consistent with at least one embodiment of the invention.
Figure 13:
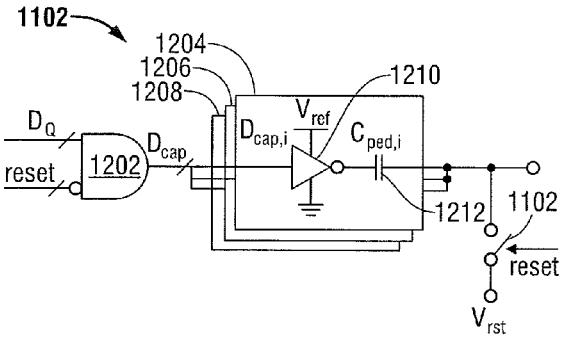
FIG. 13 illustrates a circuit diagram of an exemplary capacitive based voltage digital-to-analog converter circuit of FIG. 12.
Figure 14:
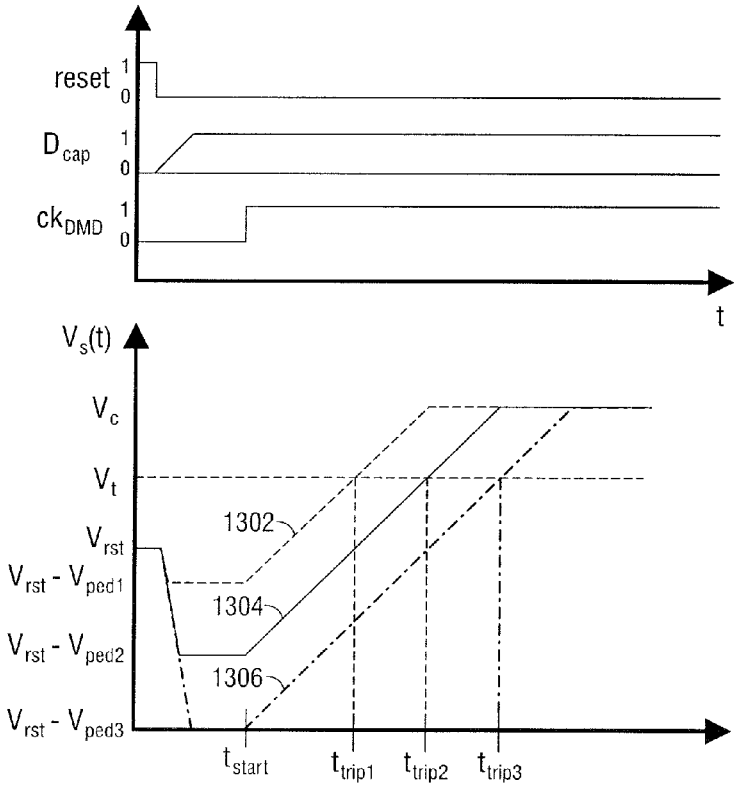
FIG. 14 illustrates timing waveforms for the exemplary pedestal voltage based delay control digital-to-time converter of FIG. 12.

To address the reset charge injection of digital-to-time converter 900, digital-to-time converter 1100 has a code-independent charge injection topology as illustrated in FIGS. 12-14. Digital-to-time converter 1100 includes comparator 508 having a simple, fixed, code-independent delay. After a reset interval charges node $V_s$ to a fixed reset voltage $V_{rst}$, digital-to-time converter 1100 subtracts a fixed pedestal voltage $V_{ped}$ from that reset voltage on node $V_s$ to provide code-independent charge injection. As a result, digital-to-time converter 1100 provides a ratio-metric topology having linear delay control and code-independent charge injection. Accordingly:

$$T_{PI}(D_Q) = \frac{C_S}{I_S}(V_t - V_{rst}) + T_{comp} + \frac{C_S}{I_S}\frac{V_{ref}}{2^N PI}D_Q,$$

where $$T_{PI,OS} = \frac{C_S}{I_S}(V_t - V_{rst}) + T_{comp} \text{ and } T_{PI,DAC} = \frac{C_S}{I_S}\frac{V_{ref}}{2^N PI}D_Q.$$

Digital-to-analog converter 1102 may include capacitor-based units that provide improved matching over current source-based units of other phase interpolator topologies. Since digital-to-time converter 1100 uses code-independent reset charge injection, phase interpolator errors due to charge injection are reduced or eliminated. For all values of digital control word $D_Q$, digital-to-analog converter 1102 charges the voltage on node $V_s$ to the same, predetermined reset voltage level. In response to deassertion of the reset control signal, digital-to-analog converter 1102 applies a pedestal voltage to the sense node of comparator 508 according to digital control word $D_Q$. In at least one embodiment, digital-to-analog converter 1102 logically combines digital control word $D_Q$ with the reset control signal to generate a gated version of digital control word $D_Q$, $D_{cap}$, individual bits of which are coupled to corresponding bit cells 1204, 1206, and 1208 for proper pedestal voltage generation following the reset phase. In at least one embodiment of digital-to-analog converter 1102, each of the bit cells 1204 includes corresponding inverter 1210 and corresponding pedestal capacitor 1212 that separately charges or discharges the sense node to realize a combined voltage on the sense node of $V_{rst}-V_{ped}(D_Q)$. As $D_Q$ increases, $V_{ped}(D_Q)$ increases, thereby increasing the time between the slew start time $t_{start}$ to the trip point $t_{trip}$ of comparator 508 and thus increasing the delay of $ck_{out}$. For example, $D_Q$ associated with $V_{ped1}$ and $t_{trip1}$ is less than the value of $D_Q$ associated with $V_{ped2}$ and $t_{trip2}$ and the value of digital control word $D_Q$ associated with $V_{ped3}$ and $t_{trip3}$, as illustrated by corresponding $V_s(t)$ curves 1302, 1304, and 1306, respectively.

Figure 15:
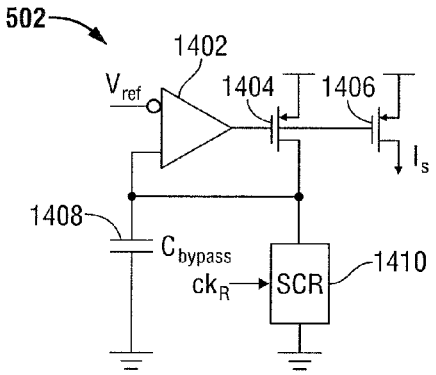
FIG. 15 illustrates an exemplary voltage-to-current generator circuit including a switched-capacitor resistor of the exemplary pedestal voltage based delay control digital-to-time converter of FIG. 12.
Figure 16:
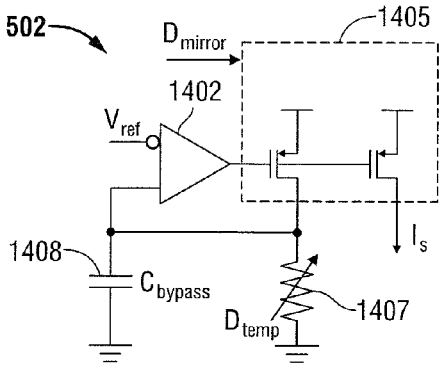
FIG. 16 illustrates an exemplary voltage-to-current generator circuit of the exemplary pedestal voltage based delay control digital-to-time converter of FIG. 12.

Referring to FIG. 15, in at least one embodiment of a digital-to-time converter, current source 502 is a ratio-metric voltage-to-current converter. Current source 502 generates a fixed current using switched-capacitor resistor 1410 controlled by reference clock signal $ck_R$. Switched-capacitor resistor 1410 is used instead of an integrated circuit resistor for ratio-metric operation of the digital-to-time converter (e.g., phase interpolator). The resistance is a function of the reference clock, which is provided by a high precision frequency source (e.g., accurate within a few parts per million). Current source 502 provides a constant current $I_S$ using precision current mirror techniques:

$$I_S=f_R C_R V_{ref},$$

where $C_R$ is the capacitance of a capacitor in switched-capacitor resistor 1410 and $f_R$ is the frequency of reference clock signal $ck_R$. Ratio-metric operation is achieved by using the same reference voltage $V_{ref}$ used by digital-to-analog converter 1102. If the period of the reference clock $T_R$ is set to be equal to $N_{ref}\times T_{ref}$, and the capacitor is trimmed to have $C_R=N_{ref}C_S$ (assuming a current mirror ratio of one) then:

$$T_{PI}(D_Q) = T_{ref}\frac{V_t - V_{rst}}{V_{Ref}} + T_{comp} + \frac{T_{ref}}{2^N PI}D_Q,$$

Trimming may reduce or eliminate gain error at production test although variation due to environmental factors remains. Current-copier techniques may also be used to reduce or eliminate current mirror errors. Increasingly ratio-metric behavior that reduces deterministic jitter and random jitter may be achieved by deriving $V_t$ and $V_{rst}$ from $V_{ref}$. In at least one embodiment of current source 502, the current $I_S$ may be digitally controlled according to the value of digital current control signal $D_{mirror}$, which may be a binary coded-signal or a thermometer-coded signal that selectively enables devices within current mirror 1405 to generate a current $I_S$ having a corresponding level. The resistance of resistor 1407 may be trimmed to reduce or eliminate gain error of an associated digital-to-time converter with respect to temperature variation. For example, resistor 1407 includes resistances having different temperature coefficients (e.g., p-type or n-type polysilicon resistors, p-type or n-type diffusion resistors, metal resistors, or other suitable resistors). The resistance of resistor 1407 may be selectable according to digital temperature sensitivity control signal $D_{temp}$. Selectively controlling current and temperature sensitivity may be used to reduce or eliminate gain errors of the digital-to-time converter as a function of temperature alone or in conjunction with other gain calibration techniques.

The techniques described above may result in a residual phase error primarily due to the quantization error resulting from the digital-to-time converter and the noise of the system. The quantization error may be due to data converter non-idealities such as offset, gain error, and integral nonlinearity. While offset is not detrimental to clock synthesizer applications, addressing gain error and integral nonlinearity are critical to spurious performance. Background calibration of the digital-to-time converter, described below, addresses gain error with the assumption that the native integral nonlinearity of the converter is acceptable.

Techniques for background calibration of the digital-to-time converter gain error may be used. Note that, while the calibration may be performed digitally, hardware requirements and associated power consumption may be impracticable for low cost and/or low power applications. As described above, the digital-to-time converter and dithering modulo divider form a true fractional divider. In typical usage, the fractional divider is always driving edges into the phase detector of the PLL. However, since signal edges only occur every PLL reference clock period (e.g. 20 ns for a 50 MHz clock), calibration circuitry may perform operations between edges. Therefore, by monitoring the gain of the digital-to-time converter of the phase interpolator in the background between PLL reference clock edges, error detection and correction circuitry may reduce or eliminate gain error using analog techniques.

In at least one embodiment, a gain calibration technique exploits linearity of the digital-to-analog converter of the phase interpolator described above. Systematic nonlinearity may be reduced or eliminated with disciplined unit cell design. Use of simple capacitor-based units have reduced random mismatch as compared to units including transistors or other non-linear devices. Use of active gain error calibration reduces overhead hardware and design complexity. In addition, a target refresh rate of the calibration is independent of a divide ratio. In at least one embodiment, since the digital-to-analog converter is inactive following phase interpolator edge transmission, phase interpolator calibration is performed between edge transmissions. In at least one embodiment, the calibration technique is addressed at the block level, e.g., locally for each phase interpolator. Local calibration facilitates system integration, duplication, and design reuse.

Figure 17:
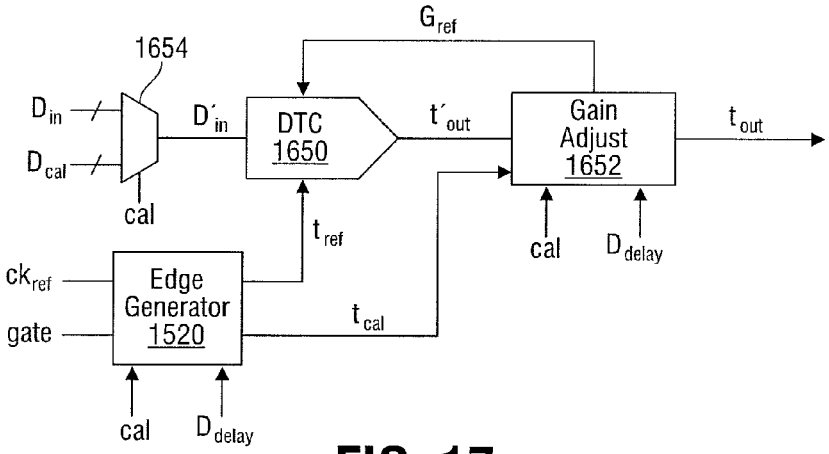
FIG. 17 illustrates a functional block diagram of an exemplary digital-to-time converter and gain calibration system consistent with at least one embodiment of the invention.
Figure 18:
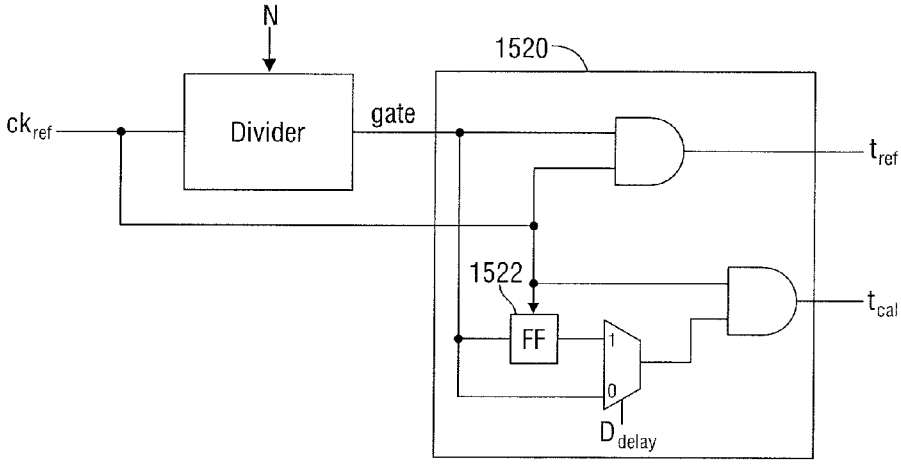
FIG. 18 illustrates an exemplary edge generation circuit of FIG. 17 consistent with at least one embodiment of the invention.

Referring to FIG. 17, a technique for compensating for a gain error of a digital-to-time converter of a phase interpolator generates a gain control signal $G_{ref}$ that is fed back to the digital-to-time converter 1650. Digital-to-time converter 1650 generates output analog signal $t'_{out}$ based on a digital input signal $D'_{in}$. During evaluation intervals (i.e., when calibration is not enabled, e.g., intervals during which cal='0'), selection module 1654 provides digital signal $D_{in}$ as digital input signal $D'_{in}$. During background calibration intervals (e.g., intervals during which cal='1') selection module 1654 provides a calibration digital signal $D_{cal}$ as digital input signal $D'_{in}$. Referring to FIGS. 17 and 18, edge generator 1520 provides clock signal $t_{ref}$ and calibration clock signal $t_{cal}$, both generated with the same delay to reference clock signal $ck_{ref}$. Clock signal $t_{ref}$ is used by digital-to-time converter 1650, e.g., as evaluate control signal $ck_{DMD}$ of digital-to-time converter including unit cell 700 of FIG. 8, digital-to-time converter 900 of FIG. 10, or digital-to-time converter 1100 of FIG. 12. Referring back to FIGS. 17 and 18, calibration clock signal $t_{cal}$ vacillates between a low value that corresponds to a minimum delay and a high value that corresponds to a minimum delay plus one full reference clock signal $ck_{ref}$ period delay (e.g., generated using delay element 1522, which may be a flip-flop or other element providing a suitable delay) according to the value of delay control signal $D_{delay}$.

In at least one embodiment, edge generator 1520 provides calibration clock signal $t_{ref}$ based on reference clock signal $ck_{ref}$ and gating clock signal gate, which is a frequency-divided version of reference clock signal $ck_{ref}$ (e.g., frequency-divided by N). Accordingly, calibration clock signal $t_{cal}$ includes a stream of pulses occurring when calibration is enabled. Individual pulses of the stream alternate between pulses having edges that nominally correspond to edges of pulses of clock signal $t_{ref}$ and pulses having edges that nominally correspond to edges of $t_{ref}$ delayed by an entire period of reference clock signal $ck_{ref}$, which will be described further below with reference to FIGS. 20-24, where $t_{ref}$, $t_{cal}$, and $t'_{out}$ of FIGS. 17 and 18 correspond to clock signals $ck_{DMD}$, $ck_D$, and $ck_{PI}$, respectively, of FIGS. 21-25.

Referring back to FIGS. 17 and 18, gain adjustment generator 1652 may provide output clock signal $t'_{out}$ as output clock signal $t_{out}$ during evaluation intervals. When performing background calibration, gain adjustment generator 1652 generates an analog gain adjustment that is fed back to digital-to-time converter 1650 to compensate for gain error of digital-to-time converter 1650.

Figure 19:
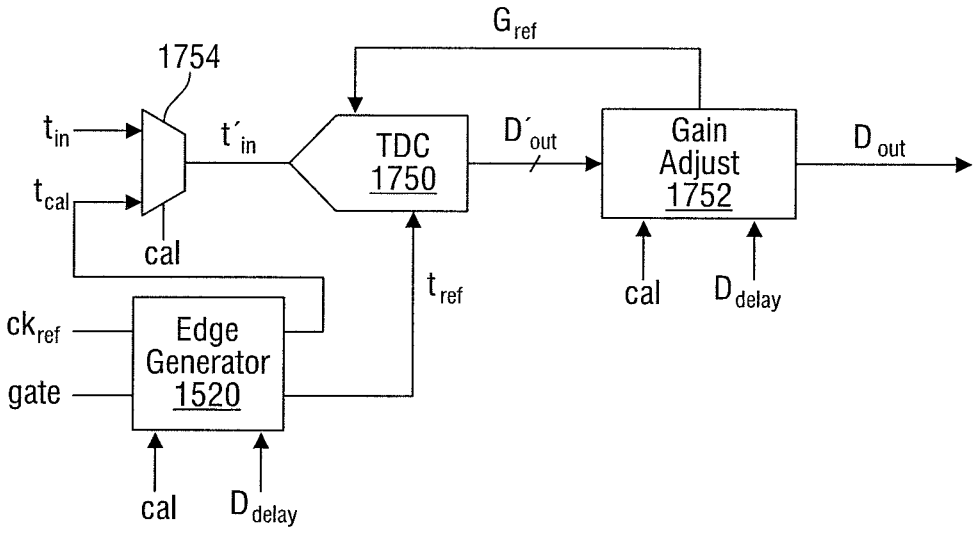
FIG. 19 illustrates a functional block diagram of an exemplary time-to-digital converter and analog gain calibration system consistent with at least one embodiment of the invention.
Figure 20:
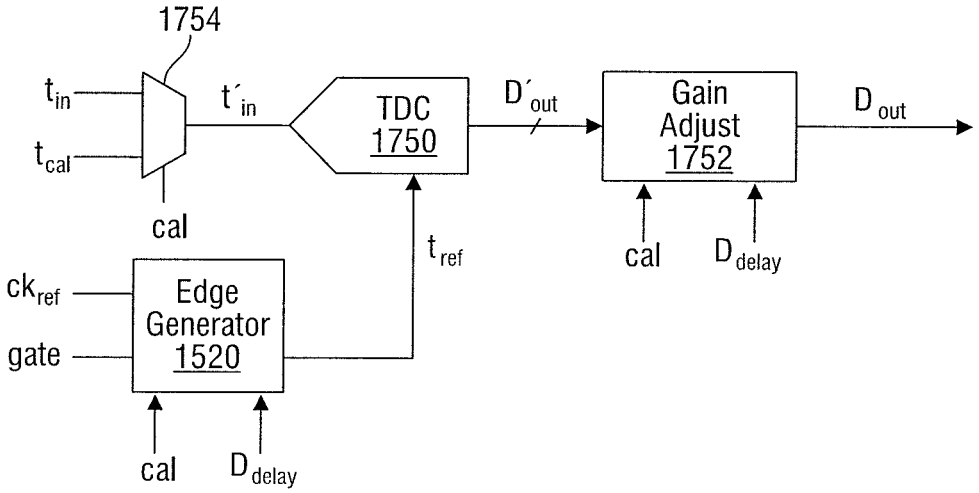
FIG. 20 illustrates a functional block diagram of an exemplary time-to-digital converter and digital gain calibration system consistent with at least one embodiment of the invention.

Referring to FIG. 19, the gain calibration techniques described herein with regard to digital-to-time converters may be applied to time-to-digital converters that include a digital-to-time converter. For example, the techniques may be adapted to generate an analog gain adjustment $G_{ref}$ that is fed back to the time-to-digital converter 1750 to compensate for gain error of time-to-digital converter 1750. Time-to-digital converter 1650 generates output digital signal $D'_{out}$ based on an analog input signal $t'_{in}$. During evaluation intervals (i.e., when calibration is not enabled, e.g., intervals during which cal='0'), selection module 1754 provides analog signal $t_{in}$ as $t'_{in}$. During background calibration intervals (e.g., intervals during which cal='1'), selection module 1754 provides a calibration analog signal $t_{cal}$. In at least one embodiment of the gain calibration technique, gain adjustment generator 1752 generates a digital gain adjustment that is internally applied to the output digital signal $D'_{out}$ to generate adjusted output digital signal $D_{out}$ (FIG. 20).

Figure 21:
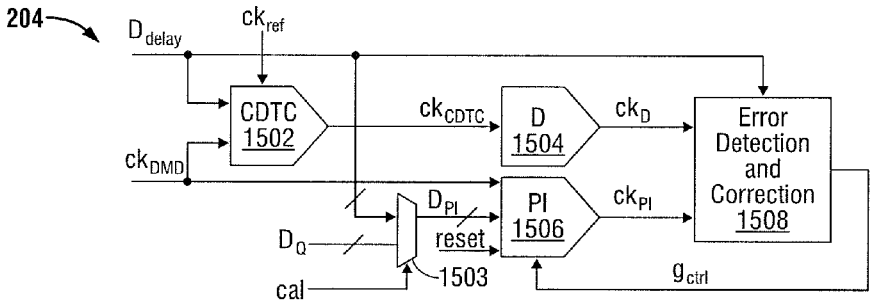
FIG. 21 illustrates a functional block diagram of an exemplary phase interpolator and phase interpolator gain calibration circuit consistent with at least one embodiment of the invention.

In at least one embodiment of the calibration technique, the digital-to-time converter is a phase interpolator configured to generate phase interpolator output $ck_{PI}$, based on clock signal $ck_{DMD}$, which is the output of a fractional divider (e.g., the output of feedback clock signal $ck_{fb}$ or output clock signal $ck_{out}$ output by respective phase interpolators 204 responsive to respective fractional dividers 108 of corresponding interpolative dividers 202 of FIGS. 2 and 3). Referring to FIG. 21, error detection and correction module 1508 generates gain control signal $g_{ctrl}$ based on phase interpolator output $ck_{PI}$ and feeds back gain control signal $g_{ctrl}$ to phase interpolator 1506 to compensate for gain error of phase interpolator 1506. Delay module 1504 is a delay matching module that matches the delay of the phase interpolator 1506 such that delayed reference signal $ck_D$ is delayed by the same amount as phase interpolator output $ck_{PI}$ (e.g., delay introduced by comparator 508 of digital-to-time converter 1100 of FIG. 12) in the minimum delay condition (e.g., delay control signal $D_{PI}$ equals zero).

Referring back to FIG. 21, error detection and correction module 1508 compares edges of the output of phase interpolator 1506 (i.e., phase interpolator output $ck_{PI}$ generated during calibration intervals), and the output of delay module 1504, delayed reference signal $ck_D$, generated during calibration intervals to determine the gain error. Delay module 1504 receives pulses for error detection as calibration timing reference signal $ck_{CDTC}$. During evaluation intervals (e.g., intervals during which cal='0') during which phase interpolator 1506 transmits delayed edges, calibration timing reference signal $ck_{CDTC}$ may be static and does not transition. Calibration digital-to-time converter 1502 generates the calibration timing reference signal $ck_{CDTC}$ based on a reference clock signal $ck_{ref}$ and a delay control signal $D_{delay}$. When in calibration intervals (e.g., intervals during which cal='1'), calibration digital-to-time converter 1502 delays the same, or related, gate signal as is used to derive clock signal $ck_{DMD}$ based on delay control signal $D_{delay}$ to generate timing reference signal $ck_{CDTC}$.

In at least one embodiment of phase interpolator 204, delay control signal $D_{delay}$ vacillates between a low value that corresponds to a minimum delay and a high value that corresponds to a minimum delay plus one full $ck_{ref}$ period delay (e.g., a delay generated using delay element 1612 for a delay equivalent to $D_{PI}=2^{NPI}$) or an entire least-significant bit of FDIV. Accordingly, the output of calibration digital-to-time converter 1502 is a timing reference signal $ck_{CDTC}$ that is a stream of pulses occurring when calibration is enabled. Individual pulses of the stream alternate between pulses having edges that nominally correspond to edges of pulses of clock signal $ck_{DMD}$ and pulses having edges that nominally correspond to edges of $ck_{DMD}$ delayed by an entire period of $ck_{ref}$. Although illustrated using rising edges of $ck_{ref}$, other embodiments generate calibration timing reference signal $ck_{CDTC}$ based on falling edges of $ck_{ref}$.

Figure 22:
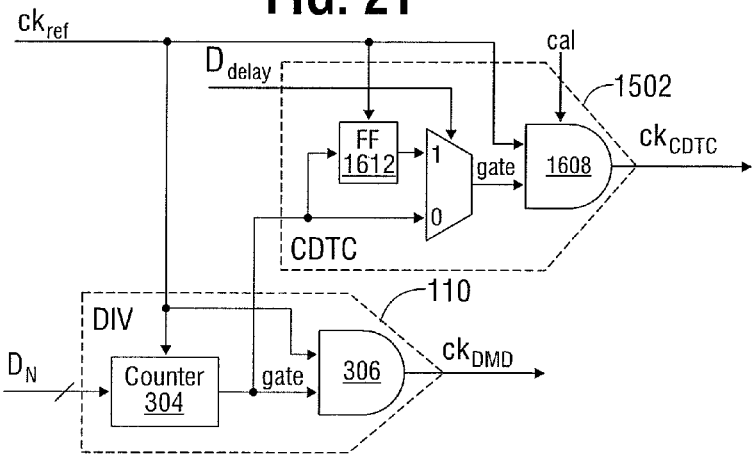
FIG. 22 illustrates a functional block diagram of exemplary time reference generator circuits of FIG. 21 consistent with at least one embodiment of the invention.

Referring to FIGS. 21 and 22, divider 110 generates a clock signal $ck_{DMD}$, having pulses with periods that vacillate between different clock periods to generate the reference timing signal for both calibration and evaluation intervals having a period based on the integer value $D_N$. For example, during the interval between time $t_1$ and time $t_2$, clock signal $ck_{DMD}$ has a period according to integer value $D_N$ in an evaluation mode (i.e., a transmit mode) corresponding to a clock signal being generated by the target application (e.g., the value of $D_N$ corresponds to three periods of $ck_{ref}$). During a calibration interval, e.g., the interval between time $t_2$ and time $t_3$, clock signal $ck_{DMD}$ includes a pulse (e.g., rising edge) with a period according to integer value $D_N$ corresponding to a clock signal being generated for use during the calibration interval (e.g., integer value $D_N$ corresponds to four periods of $ck_{ref}$). In at least one embodiment of phase interpolator 204, multiplexer 1503 spreads a binary or otherwise coded delay control signal $D_{delay}$ to a number of bits corresponding to the number of unit delay cells included in phase interpolator 1506. For example, when $D_{delay}$='0,' and NPI=2, then phase interpolator 1506 has four unit cells (one of which is in addition to unit cells corresponding to bits output by multiplexer 1503 and which is driven by the output of a logical AND of $D_{delay}$ and cal), then $D_{PI}$='0000,' and when delay control signal $D_{delay}$='1,' then $D_{PI}=2^{NPI}$='1111,' which corresponds to delaying by an entire period of $ck_{ref}$.

Figure 23:
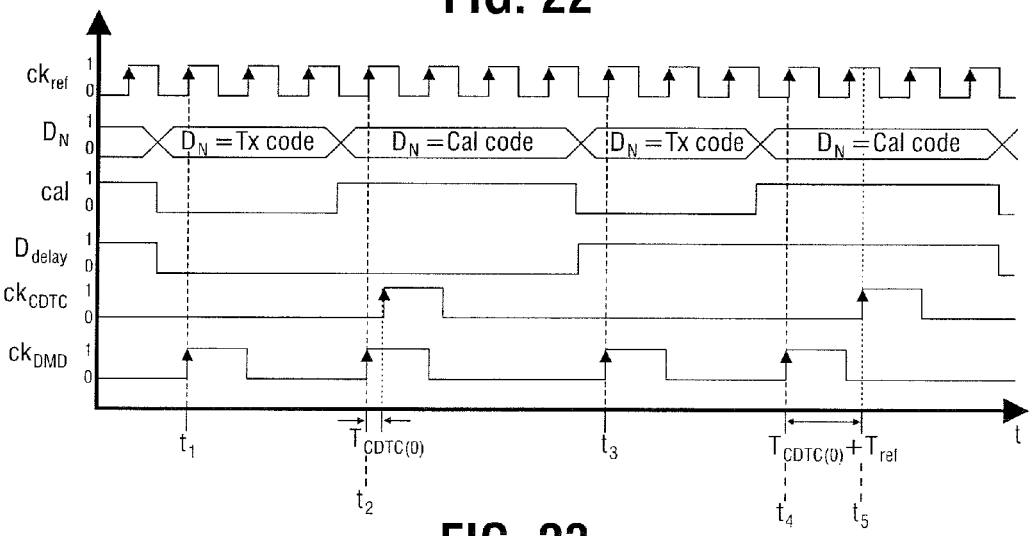
FIG. 23 illustrates timing waveforms for the exemplary phase interpolator and phase interpolator gain calibration circuit and time reference generator circuits of FIGS. 21 and 22.

FIGS. 22 and 23, illustrate at least one embodiment of timing reference signal generation. In at least one embodiment, calibration digital-to-time converter 1502 is a single bit digital-to-time converter with a least-significant bit of $T_{ref}$. When delay control signal $D_{delay}=0$, $ck_{CDTC}$ is delayed from $ck_{DMD}$ by $T_{CDTC}(0)$, which is ideally zero. When delay control signal $D_{delay}=1$, $ck_{CDTC}$ is delayed from $ck_{DMD}$ by $T_{CDTC}(1)$, which is ideally $T_{ref}$. The calibration codes are time interleaved with the phase interpolator evaluation values as signal $D_N$. Note that in at least one embodiment, corresponding pulse edges of the timing reference signal $ck_D$ are generated with a fixed delay amount $T_D$ that matches the minimum delay (e.g., $D_{PI}=0$) of phase interpolator 1506.

In at least one embodiment of a gain calibration technique, a first phase of the gain calibration, delay control signal $D_{delay}$='0,' and error detection and correction module 1508 generates an indication of a time difference between an edge of fixed delay signal $ck_D$ and a corresponding edge of phase interpolator output $ck_{PI}$:

$$\Delta T_{cal}(0)=T_{PI}(0)-[T_{CDTC}(0)+T_D].$$

In a second phase of the gain calibration, $D_{delay}$='1,' and error detection and correction module 1508 generates an indication of a time difference between an edge of delay signal $ck_D$ and an edge of phase interpolator output $ck_{PI}$:

$$\Delta T_{cal}(1)=T_{PI}(2^{NPI})-[T_{CDTC}(1)+T_D].$$

Error detection and correction module 1508 determines the difference between the two measurements to generate indicator of linear gain error $T_\gamma$:

$$T_\gamma=\Delta T_{cal}(1)-\Delta T_{cal}(0)=[T_N(2^{NPI})-T_{PI}(0)]-[T_{CDTC}(1)-T_{CDTC}(0)]=T_{PI,FS}-T_{ref},$$

where $T_{PI,FS}=[T_{PI}(2^{NPI})-T_{PI}(0)]$, and $$T_{ref}[T_{CDTC}(1)-T_{CDTC}(0)].$$

Error detection and correction module 1508 generates gain control signal $g_{ctrl}$ based on gain error $T_\gamma$. Compensating for linear gain error $T_\gamma$, matches the gain of phase interpolator 1506, which is a subrange data converter, to the gain of the fractional divider 108, to obtain a linear transfer function.

Figure 24:
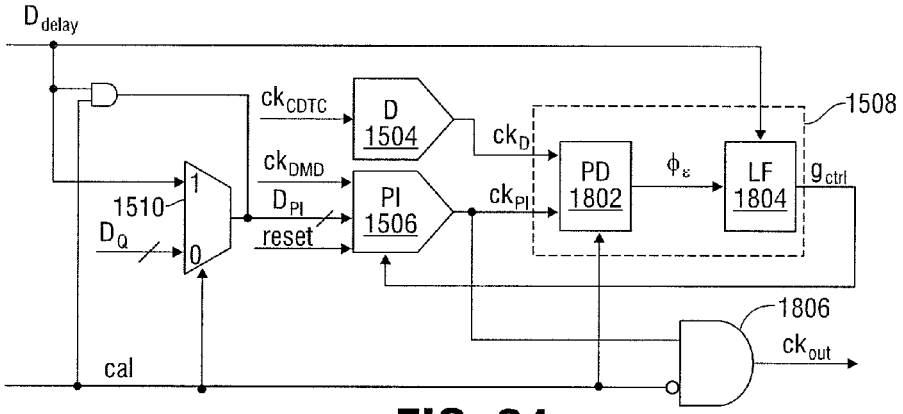
FIG. 24 illustrates a functional block diagram of an exemplary phase interpolator and phase interpolator gain calibration circuit consistent with at least one embodiment of the invention.
Figure 25:
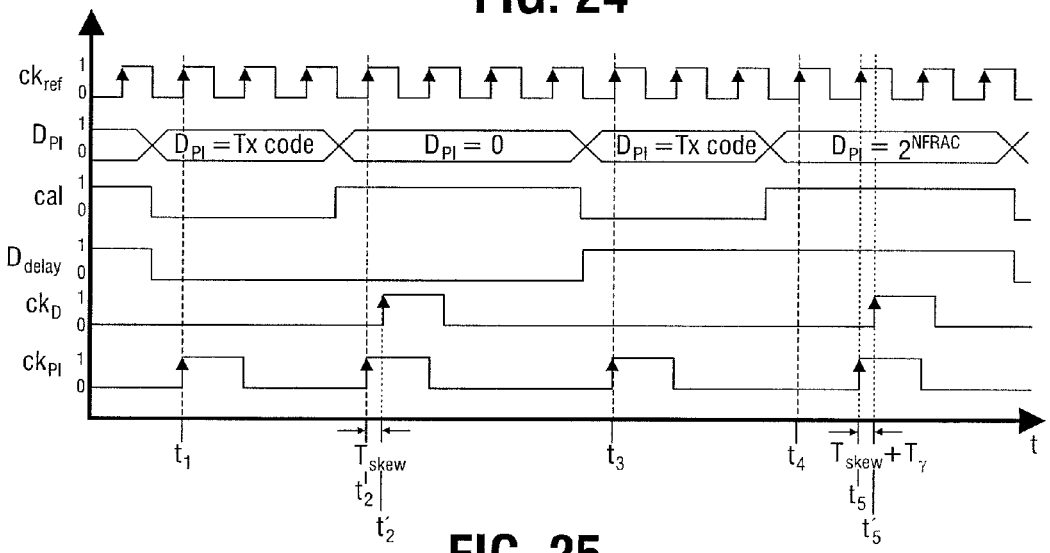
FIG. 25 illustrates timing waveforms for the exemplary phase interpolator and phase interpolator gain calibration circuits of FIGS. 21 and 24.

Referring to FIGS. 24 and 25, in each calibration phase, phase interpolator 1506 introduces a different delay into clock signal $ck_{DMD}$ to generate phase interpolator output $ck_{PI}$. When $D_{delay}=0$, clock signal $ck_{DMD}$ is delayed relative to $ck_{CDTC}$ by $T_{PI}(0)-T_D$, which is ideally zero. When $D_{delay}=1$, $ck_{DMD}$ is delayed relative to $ck_{CDTC}$ by $T_{PI}(2^{NPI})-T_D$, which is ideally $T_{ref}$. The logical AND of $D_{delay}$ and cal control signal introduce an extra least-significant bit to $D_{PI}$ so that the full-scale range may be generated between the two calibration measurements (without this extra bit, the maximum code is $2^{NPI}-1$). Note that $T_{skew}=T_{CDTC}(0)+T_D-T_{PI}(0)$. The gain error and correction signal generation of error detection and correction module 1508 may be implemented using digital circuits, analog circuits, or a combination thereof. In at least one embodiment, an analog implementation includes phase detector 1802 and a loop filter 1804, which are configured to generate phase interpolator gain control signal $g_{ctrl}$. In at least one embodiment, digital control within error detection and correction module 1508 includes a time-to-digital converter coupled to a digital loop filter and a gain control signal provided to an auxiliary digital-to-analog converter. In at least one embodiment, an analog phase detector provides signals to an analog loop filter that generates signals provided to phase interpolator auxiliary digital-to-analog converter. Note that during calibration phases, gating circuit 1806 may block propagation of $ck_{PI}$ to $ck_{out}$.

Figure 26:
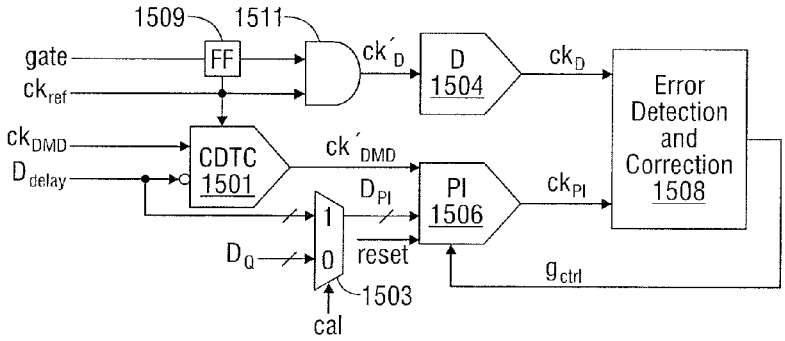
FIG. 26 illustrates a functional block diagram of an exemplary phase interpolator and phase interpolator gain calibration circuit consistent with at least one embodiment of the invention.

Rather than delaying both $ck_D$ and $ck_{PI}$ in the calibration mode, by applying a delay that vacillates between a low value that corresponds to a minimum delay and a high value that corresponds to a minimum delay plus one full $ck_{ref}$ period delay in parallel, in separate paths as described above with reference to FIGS. 21-25, other embodiments of the calibration technique apply the two vacillating delays in series, in the same path, but out of phase with each other. For example, referring to FIG. 26, an embodiment of the calibration technique generates timing reference signal $ck'_D$ having a fixed delay. Delay element 1509 and logic gate 1511 generate timing reference signal $ck'_D$. Timing reference signal $ck'_D$ lags clock signal $ck_{DMD}$ by one period of reference clock signal $ck_{ref}$. In calibration mode, the technique applies a first vacillating delay to clock signal $ck'_{DMD}$ to generate an input to the phase interpolator. In calibration mode, the phase interpolator applies a second vacillating delay serially to generate the output signal $ck_{PI}$. The first vacillating delay vacillates between the low value that corresponds to the minimum delay and the high value that corresponds to the minimum delay plus one full period of reference clock signal $ck_{ref}$, and the second vacillating delay vacillates between the high value that corresponds to the minimum delay plus one full period of reference clock signal $ck_{ref}$, and the low value that corresponds to the minimum delay. Accordingly, the first and second vacillating delays introduce a net delay of one full period of reference clock signal $ck_{ref}$. Error detection and correction circuit 1508 generates an indication of a time difference between an edge of fixed delay signal $ck_D$ and a corresponding edge of phase interpolator output $ck_{PI}$:

$$\Delta T_{cal}(0)=[T_{CDTC}(1)T_{PI}(0)]-[T_{ref}+T_D].$$

In a second phase of the gain calibration, $D_{delay}$='1,' and error detection and correction module 1508 generates an indication of a time difference between an edge of delay signal $ck_D$ and an edge of phase interpolator output $ck_{PI}$:

$$\Delta T_{cal}(1)=[T_{CDTC}(0)+T_{PI}(2^{NPI})]-[T_{ref}+T_D].$$

Error detection and correction module 1508 determines the difference between the two measurements to generate indicator of linear gain error $T_\gamma$:

$$T_\gamma=\Delta T_{cal}(1)-\Delta T_{cal}(0)=[T_{CDTC}(0)+T_{PI}(2^{NPI})]-[T_{CDTC}(1)+T_{PI}(0)]=T_{PI,FS}-T_{ref}.$$

where $T_{PI,FS}=[T_{PI}(2^{NPI})-T_{PI}(0)]$, and $$T_{ref}=[T_{CDTC}(0)-T_{CDTC}(1)].$$

When phase interpolator 1506 has the proper gain, $T_{PI,FS}=T_{ref}$ and no additional gain adjustment is needed. Although the fixed delay of $T_{ref}$ introduced into $ck'_D$ is not necessary, it may reduce the systematic phase error between fixed delay signal $ck_D$ and phase interpolator output $ck_{PI}$ in the calibration mode, which reduces the dynamic range requirements of error detection and correction module 1508.

Figure 27:
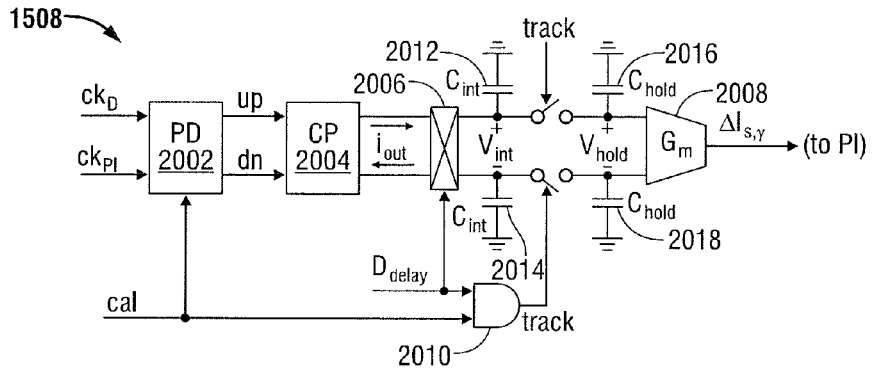
FIG. 27 illustrates a functional block diagram of an exemplary gain error detection and correction circuit consistent with at least one embodiment of the invention.

Referring to FIG. 27, analog error detection and correction module 1508 generates a gain control compensation signal $\Delta I_{s,\gamma}$ that is provided to the current source of the digital-to-time converter of the phase interpolator. During a first calibration interval, delay control signal $D_{delay}$ has a first value. Phase detector 2002 generates up and down signals based on a first time difference in phases of reference signal $ck_D$ and phase interpolator output $ck_{PI}$. Charge pump 2004 converts the first time difference into differential charge that is stored on integrating capacitors 2012 and 2014, each having capacitance $C_{int}$. The charge pump output is based on the difference between the digital-to-time converter delay at a minimum delay (i.e., $D_Q=0$) and the delay through calibration digital-to-time converter 1502 and delay module 1504. During a second calibration interval, delay control signal $D_{delay}$ has a second value. The charge pump output is based on the difference between the digital-to-time converter delay at a maximum delay (i.e., $D_Q=2^{NPI}$) and the delay through calibration digital-to-time converter 1502 and delay module 1504. Phase detector 2002 generates up and down signals based on a second time difference in phases of reference signal $ck_D$ and phase interpolator output $ck_{PI}$. Charge pump 2004 converts the second time difference into a second differential charge, switch 2006 inverts the second differential charge, and stores that inverted difference in charge on integrating capacitors 2012 and 2014. When in the second calibration interval, the track signal causes charge transfer to hold capacitors 2016 and 2018, which updates $V_{hold}$. Transconductance amplifier 2008 generates the gain control signal $\Delta I_{s,\gamma}$, that is used to adjust the slew current to correct for the gain error. Note that switch 2006 facilitates a subtraction function to isolate gain error $T_\gamma$ from the two measurements. In addition, note that the critical paths are identical between the two measurements. However, note that charge-sharing due to $T_{skew}$ may cause systematic gain error.

Figure 28:
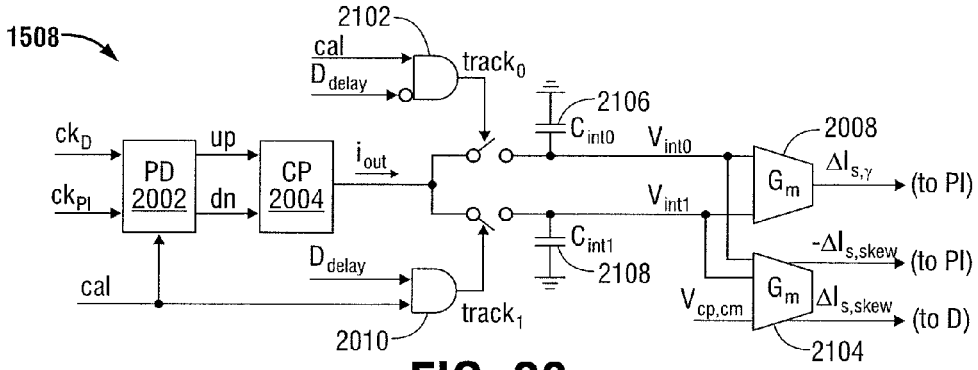
FIG. 28 illustrates a functional block diagram of an exemplary gain error and skew detection and correction circuit consistent with at least one embodiment of the invention.

Referring to FIG. 28, in at least one embodiment, in addition to generating gain control signal $\Delta I_{s,\gamma}$, analog error detection and correction module 1508 also generates a differential skew correction signal, $\Delta I_{s,skew}$, which may be combined with a current source control signal to compensate for the skew between outputs of those two modules. One of the complementary signals (e.g., $-\Delta I_{s,skew}$) of the differential signal is combined with a current source control signal of the phase interpolator 1506 and the other of the complementary signals (e.g., $\Delta I_{s,skew}$) is combined with a current source control signal of delay module 1504. In operation, during a first calibration interval, $D_{delay}$ has a first value. Phase detector 2002 generates up and down signals based on a first time difference in phases of reference signal $ck_D$ and phase interpolator output $ck_{PI}$. Charge pump 2004 converts the first time difference into a first differential charge, the $track_0$ signal causes charge transfer of that charge to integrating capacitor 2106. During a second calibration interval, $D_{delay}$ has a second value. Phase detector 2002 generates up and down signals based on a second time difference in phases of $ck_D$ and $ck_{PI}$. Charge pump 2004 converts the second time difference into a second differential charge, and the $track_1$ signal causes charge transfer of that charge to integrating capacitor 2108. Differential-to-common mode transconductance amplifier 2008 applies gain control signal $\Delta I_{s,\gamma}$ to adjust the slew current of the phase interpolator. A common-mode-to-differential-mode transconductance amplifier 2014 applies skew correction by differentially applying slew currents of phase interpolator 1506 and delay module 1504 although in other embodiments, all of the skew correction may be applied to the phase interpolator 1506 delay elements or all of the skew correction may be applied to the delay elements of delay module 1504. Note that charge-sharing due to $T_\gamma$ may cause systematic gain error, charge pump 2004 has a finite output resistance, and supporting a differential voltage, $V_{int1}-V_{int0}$ may cause gain errors. In addition, note that controlling slew current $I_s$ affects the control loop for both calibration and evaluation:

$$T_{PI}(D_Q) = \frac{C_S}{I_S}(V_t - V_{rst}) + T_{comp} + \frac{C_S}{I_S}\frac{V_{ref}}{2^N \text{frac}} D_Q,$$

Changing the slew current $I_s$ controls the gain of the phase interpolator, which is desired, but also affects the skew measurement in a calibration phase (e.g., calibration phase zero, $T_{skew}+T_{PI}(0)$, which is undesirable.

Figure 29:
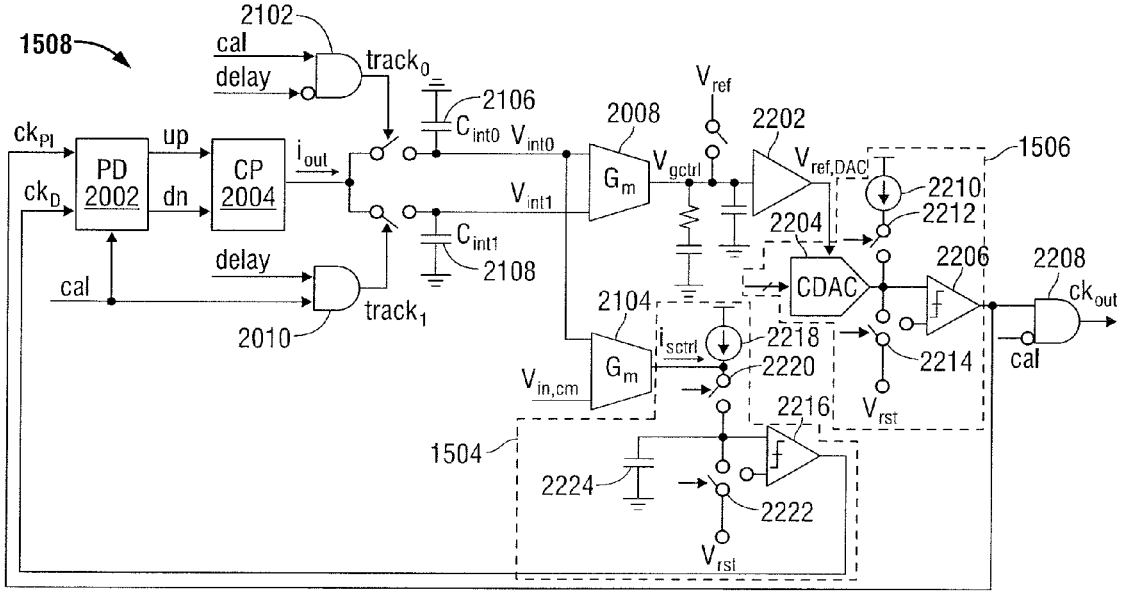
FIG. 29 illustrates a functional block diagram of an exemplary gain error detection and correction circuit consistent with at least one embodiment of the invention.

Referring to FIG. 29, in at least one embodiment, an analog implementation of error detection and correction module 1508 decouples the gain and skew control loops. The gain is corrected by controlling a voltage reference in digital-to-analog converter 2204 of phase interpolator 1506. Error detection and correction module 1508 senses skew only from $V_{int0}$. The two integrator loop forces $V_{int1}-V_{int0}$ to within a transconductor offset voltage, which reduces charge sharing error. The charge-sharing error may be further reduced by auto-zeroing the gain control transconductor. In other embodiments, correction of the delay module 1504 may also be implemented using voltage control of a reference voltage. Note that $V_{gctrl}-V_{ref}$ for trim at production test and upon startup.

Figure 30:
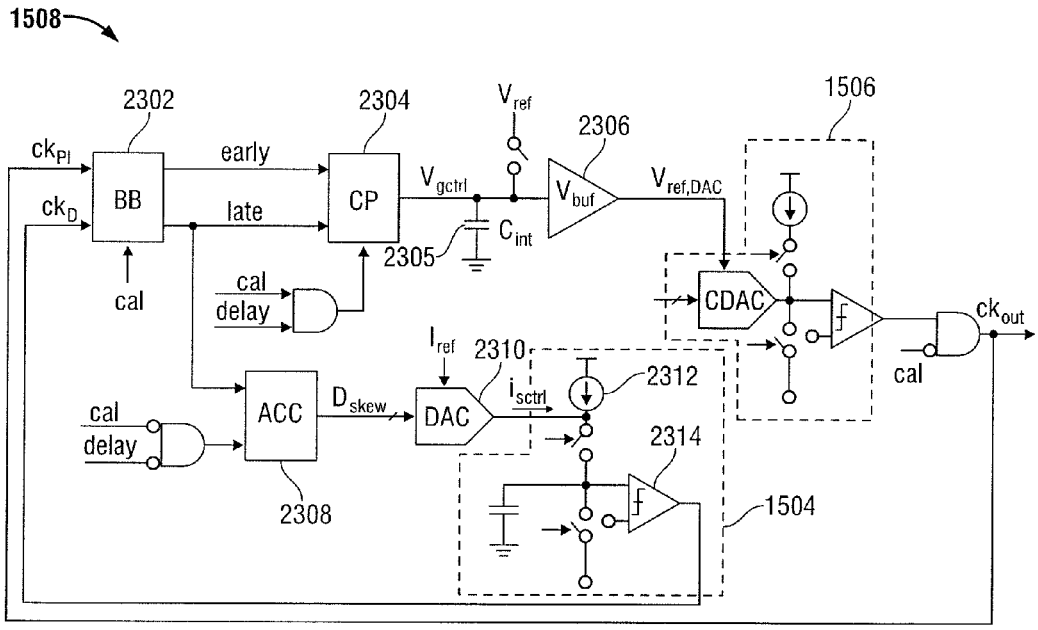
FIG. 30 illustrates a functional block diagram of an exemplary gain error detection and correction circuit including a bang-bang phase detector consistent with at least one embodiment of the invention.

Referring to FIG. 30, in at least one embodiment, error detection and correction module 1508 includes bang-bang phase detector 2302 coupled to digital accumulator 2308, and current digital-to-analog converter 2310, which reduces or eliminates $T_{skew}$ and issues associated with an analog control loop implementation (e.g., charge sharing). Charge pump 2304 and capacitor 2305 are configured as an integrating switched current digital-to-analog converter. The charge pump output may include small up/down charge packets to reduce $V_{gctrl}$ ripple. However, note that this configuration dithers around on average, causing ripple in the control signal and resulting in quantization noise. In other embodiments, correction of the delay module 1504 may be implemented using a charge pump and integrating switched-current digital-to-analog converter control.

Figure 31:
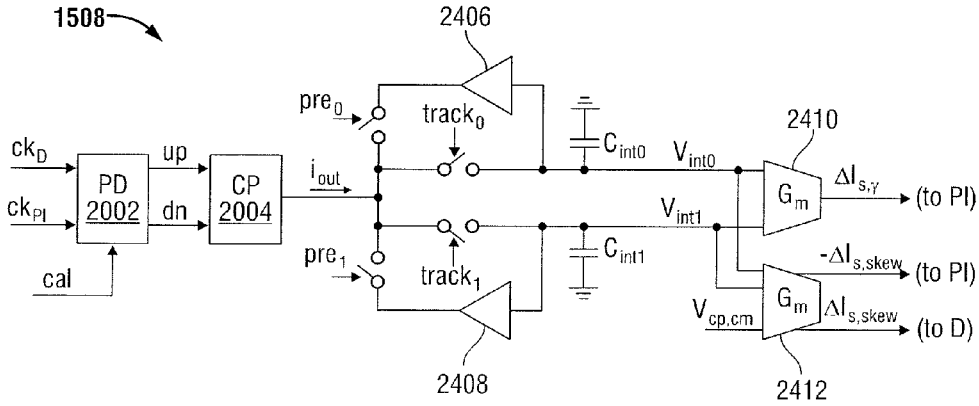
FIG. 31 illustrates a functional block diagram of an exemplary gain error detection and correction circuit including pre-charge voltage buffers consistent with at least one embodiment of the invention.
Figure 32:
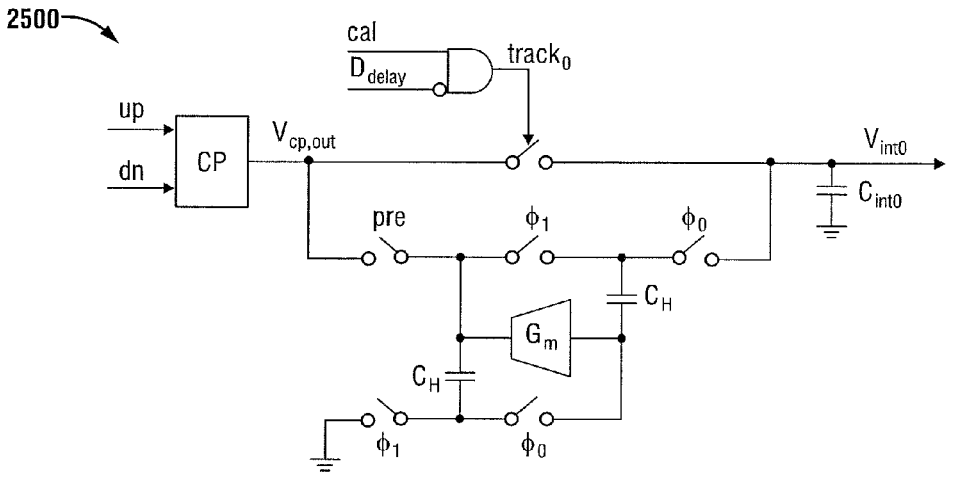
FIG. 32 illustrates a functional block diagram of an exemplary gain error detection and correction circuit having reduced charge sharing consistent with at least one embodiment of the invention.

Referring back to FIG. 28, charge-sharing at the output of charge pump 2004 behaves like a switched-capacitor resistor between nodes $V_{int0}$ and $V_{int1}$, which results in a reduction in DC charge pump gain. Sustaining a differential voltage across nodes $V_{int0}$ and $V_{int1}$ may cause a substantial gain error. A technique for reducing or eliminating that contribution to gain error is illustrated in FIG. 31. Error detection and correction module 1508 includes pre-charge voltage buffer 2406 and pre-charge voltage buffer 2408 for each of capacitor nodes $C_{int0}$ and $C_{int1}$. Pre-charge voltage buffer 2406 and pre-charge voltage buffer 2408 are configured to force the respective nodes coupled to the output of the charge pump 2004 to $V_{int0}$ and $V_{int1}$, respectively, prior to connecting those nodes to $C_{int0}$ and $C_{int1}$, respectively. Accordingly, the charge-sharing is reduced to the buffer offset voltage. In other embodiments, the switched-capacitor buffers 2406 and 2408 of error are modified to be an integrator with noise cancellation, as illustrated in FIG. 32 for one calibration phase (i.e., for the $D_{delay}=0$ calibration phase). Although not shown, the integrator with noise cancellation circuitry is replicated for the other calibration phase (i.e., for the $D_{delay}=1$ calibration phase). Such technique substantially reduces charge-sharing in analog error detection and correction module 1508.

Figure 33:
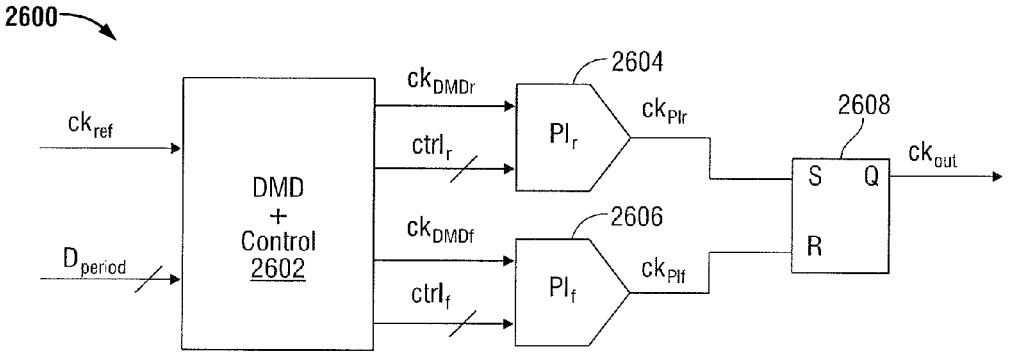
FIG. 33 illustrates a functional block diagram of an exemplary time interleaving interpolative divider consistent with at least one embodiment of the invention.

Interpolative divider techniques that interleave evaluate or transmit operations with calibration operations, as described above, use a reference clock signal that is at least twice the frequency of the transmit operation. Referring to FIG. 33, by interleaving multiple interpolative dividers, an output clock signal with approximately 50% duty cycle may be achieved. The interleaved interpolative divider implementation may double the output clock frequency or relax calibration timing requirements. Dithering-modulo-divider and controller 2602 alternates between phase interpolator 2604 and phase interpolator 2606. While phase interpolator 2604 transmits a rising edge, which causes a rising edge on $ck_{out}$, phase interpolator 2606 makes a calibration measurement. Phase interpolator 2606 transmits a rising edge, which causes a falling edge on $ck_{out}$, while phase interpolator 2604 performs a calibration measurement. Flip-flop 2608 latches the rising edge $ck_{PIr}$ from phase interpolator 2604 and the falling edge $ck_{PIf}$ from phase interpolator 2606 and generates output clock $ck_{out}$ having approximately 50% duty cycle. Note that more interleaving can support higher frequency operation at e.g., radio frequencies.

Figure 34:
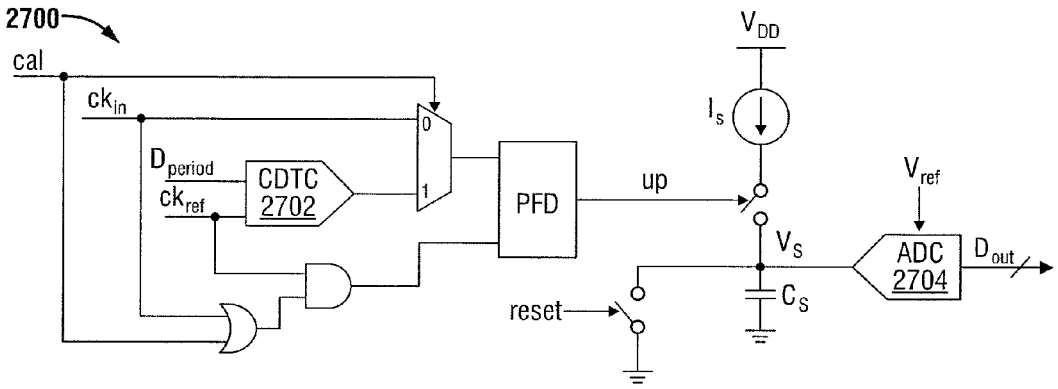
FIG. 34 illustrates a functional block diagram of an exemplary time-to-digital converter consistent with at least one embodiment of the invention.

The gain calibration interleaving with digital-to-time signal evaluation techniques described herein may be applied to time-to-digital signal conversion applications. For example, referring to FIG. 34, a gain measurement is interleaved between edges of clock $ck_{in}$. Use of the calibration digital-to-time converter facilitates a two-point measurement with a precise time base having reference period $T_{ref}$. Similar to the digital-to-time calibrations discussed above, the control loop may change reference voltage $V_{ref}$ to force accurate time-to-digital gain. A difference between code $D_T$ generated by analog-to-digital converter 2704 determines a gain of the time-to-digital converter. Skew between the calibration mode and the input path introduces a fixed offset between time stamps. As a result, additional range greater than reference period $T_{ref}$ (as defined by the period of clock signal $ck_{ref}$) may be required for the analog-to-digital conversion in order to reduce or eliminate over-ranging (i.e., saturation of the analog-to-digital converter).

Figure 35:
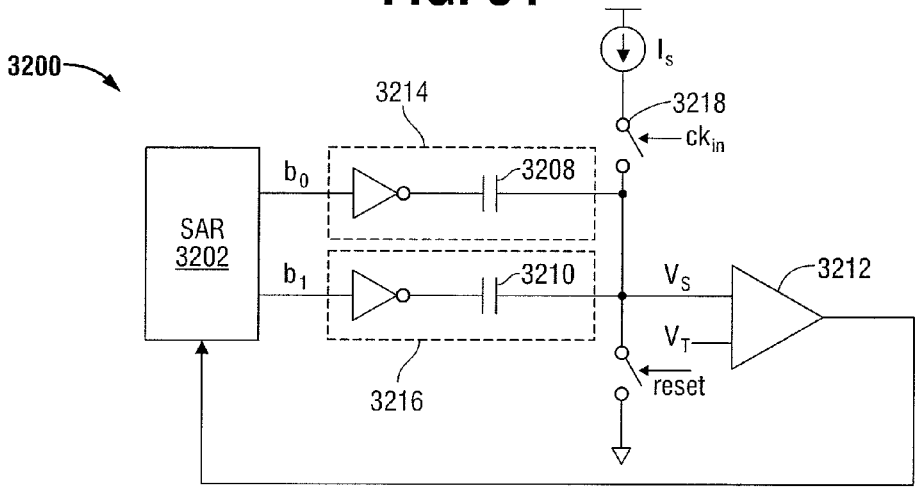
FIG. 35 illustrates a functional block diagram of an exemplary successive approximation time-to-digital converter consistent with at least one embodiment of the invention.

Referring to FIG. 35, exemplary time-to-digital converter 3200 includes capacitance $C_S$ distributed across capacitors 3208 and 3210 of feedback digital-to-analog converter units (e.g., digital-to-analog converter units 3214 and 3216 similar to digital-to-analog converter 1102 of digital-to-time converter 1100 of FIGS. 12-14) of a digital-to-analog converter configured to sample-and-hold input signal $ck_{in}$. Comparator 3212 uses the comparator threshold voltage $V_T$ to compare against the stored input time signal $V_S$ generated by sample-and-hold of input signal $ck_{in}$. Comparator 3212 provides the results of the comparison to successive approximation register 3202. Successive approximation register 3202 provides a digital approximation code to the internal capacitor-based digital-to-analog converter that supplies comparators 3212 with an analog voltage representation of the digital approximation code. Thus, analog-to-digital converter 3200 generates output digital bits $b_0$ and $b_1$, which collectively form an output digital signal $D_{out}$ and are based on input analog signal $V_S$, originally derived from an input time interval. The time domain information may be mapped into voltages and digital-signal processing techniques may be used to determine distances, velocities, etc. based on that time domain information in radar or other applications.

Figure 36:
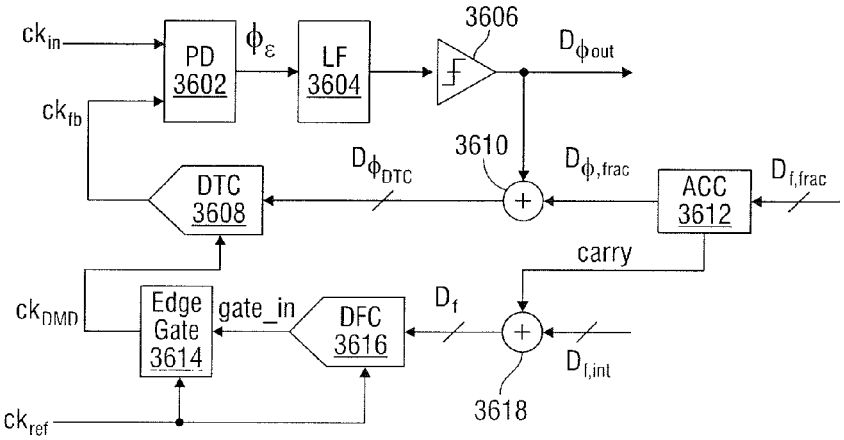
FIG. 36 illustrates a functional block diagram of an exemplary high-resolution time-to-digital converter consistent with at least one embodiment of the invention.

An embodiment of the digital-to-time converter and calibration technique described above may be included as a feedback digital-to-analog converter in a high resolution time-to-digital converter application. Referring to FIG. 36, an exemplary high-resolution time-to-digital converter receives input signal $ck_{in}$, and digital control words $D_{f,int}$ and $D_{f,frac}$ which correspond to coarse and fine frequency divider control codes, respectively. Accumulator 3612 integrates the fine frequency divider control code to generate a fine delay control code (i.e., fine phase domain control code $D_{\phi,frac}$) and summing node 3618 combines any carry from the integration with the coarse frequency divider control code and provides the sum to digital-to-frequency converter 3616. Phase detector 3602 generates analog phase error signal $\phi_\epsilon$ indicative of the phase difference between input signal $ck_{in}$ and feedback signal $ck_{fb}$. Loop filter 3604 integrates $\phi_\epsilon$ and quantizer 3606 generates digital phase output $D_{\phi out}$ based on the loop filter output.

Summing node 3610 combines digital phase output $D_{\phi,out}$ with fine phase domain control code $D_{\phi,frac}$ to generate digital phase control code $D_{\varphi DTC}$ for conversion to an analog signal by digital-to-time converter and calibration module 3608, which generates feedback signal $ck_{fb}$. Feedback signal $ck_{fb}$ is an analog representation of the digital output $D_{\phi out}$. Digital-to-frequency converter 3616 and edge gating circuit 3614 form a digitally controlled integer divider and generate clock signal $ck_{DMD}$ based on reference clock signal $ck_{ref}$ and digital control word $D_f$, which indicates a coarse (or integer portion) of a frequency divider value. Since the gain of the digital-to-time conversion performed by digital-to-time converter and calibration module 3608 is calibrated consistent with techniques described above, feedback clock signal $ck_{fb}$ has reduced deterministic jitter, which allows for digital output $D_{\phi out}$ to provide a higher resolution digital representation of the time information of input signal $ck_{in}$ than other time-to-digital converters. Note that in other high-resolution time-to-digital converters consistent with the teachings herein, phase-detector 3602, loop filter 3604, and quantizer 3608 may be replaced with a bang-bang phase detector or other suitable implementations.

Thus, improved techniques for digital-to-time conversion and phase interpolation for clock synthesis have been disclosed. Systematic nonlinearities in digital-to-analog conversion are reduced by using capacitor-based unit delay cells and ratio-metric design techniques. In addition, an active gain error calibration technique for block level implementation is disclosed for high-performance applications. Techniques described herein reduce or eliminate gain error of a digital-to-time converter. In applications such as fractional clock synthesis, the reduction or elimination of that gain error reduces spurious outputs due to phase wrapping errors caused by the gain error of the digital-to-time converter. Accordingly, fractional clock synthesizers using those techniques may produce clocks with spurious performance similar to integer clock synthesizer counterparts but with increased power efficiency due to increased bandwidth (e.g. suppressed VCO noise) of the fractional synthesizer. In addition, the digital-to-time conversion techniques described herein may have reduced area and power consumption as compared to other techniques.

While circuits and physical structures have been generally presumed in describing embodiments of the invention, it is well recognized that in modern semiconductor design and fabrication, physical structures and circuits may be embodied in computer-readable descriptive form suitable for use in subsequent design, simulation, test or fabrication stages. Structures and functionality presented as discrete components in the exemplary configurations may be implemented as a combined structure or component. Various embodiments of the invention are contemplated to include circuits, systems of circuits, related methods, and tangible computer-readable medium having encodings thereon (e.g., VHSIC Hardware Description Language (VHDL), Verilog, GDSII data, Electronic Design Interchange Format (EDIF), and/or Gerber file) of such circuits, systems, and methods, all as described herein, and as defined in the appended claims. In addition, the computer-readable media may store instructions as well as data that can be used to implement the invention. The instructions/data may be related to hardware, software, firmware or combinations thereof.

The description of the invention set forth herein is illustrative, and is not intended to limit the scope of the invention as set forth in the following claims. For example, while the invention has been described in an embodiment in which a digital-to-time converter of a phase interpolator of a clock synthesizer is compensated, one of skill in the art will appreciate that the teachings herein can be utilized with other digital-to-time and time-to-digital converter applications. Variations and modifications of the embodiments disclosed herein, may be made based on the description set forth herein, without departing from the scope and spirit of the invention as set forth in the following claims.

What is claimed is:

1. An apparatus comprising:

a digital-to-time converter comprising:

a first node;

a second node configured to receive a reference signal;

a digital-to-analog signal converter configured to couple a passive impedance to the first node, the passive impedance being selected according to a digital code;

a first switch configured to selectively couple the first node to a second reference signal in response to an input signal; and a comparator configured to generate [the] *an* output signal based on *a comparison of* a first signal on the first node [and] *to* the reference signal [on the second node],

*wherein the digital-to-analog signal converter comprises a plurality of elements configured to receive the digital code, the digital code having a plurality of bits, each of the plurality of elements comprising:*

*an inverter configured to receive a corresponding bit of the plurality of bits; and*

*a capacitor coupled in series between the inverter and the first node.*

2. The apparatus, as recited in claim 1, wherein edges of the output signal correspond to [the] input signal edges *of the input signal* linearly delayed based on the digital code.

3. The apparatus, as recited in claim 1, wherein the digital-to-time converter further comprises a second switch configured to selectively couple the first node to a third reference signal in response to a first control signal, the first node being charged to a reset voltage level in response to the first control signal closing the second switch.

4. The apparatus, as recited in claim 3, wherein the first node is charged to a pedestal voltage level according to the passive impedance and in response to the [first and second switches being open] *first switch being open and the second switch being open*.

5. The apparatus, as recited in claim 1, wherein the digital-to-analog signal converter introduces a pedestal voltage to the first node after a reset phase.

6. The apparatus, as recited in claim 1, wherein an active phase of a first control signal couples the first node to the second reference signal, causing the first node to charge to a first voltage level; and wherein an active phase of the input signal couples the first node to the reference signal, causing the first node to charge to a second voltage level, the second voltage level being greater than a voltage level on the second node, and the voltage level on the second node being greater than the first voltage level.

[7. The apparatus, as recited in claim 1, wherein the digital-to-analog signal converter comprises:

a plurality of elements configured to receive the digital code, the digital code having a plurality of bits, each of the plurality of elements comprising:

an inverter configured to receive a corresponding bit of the plurality of bits; and a capacitor coupled in series between the inverter and the first node.]

8. [The apparatus, as recited in claim 1] *An apparatus comprising:*

*a digital-to-time converter comprising:*

*a first node;*

*a second node configured to receive a reference signal;*

*a digital-to-analog signal converter configured to couple a passive impedance to the first node, the passive impedance being selected according to a digital code;*

*a first switch configured to selectively couple the first node to a second reference signal in response to an input signal; and*

*a comparator configured to generate an output signal based on a comparison of a first signal on the first node to the reference signal,* wherein the input signal and the digital code are generated by a frequency divider according to a divide code and a reference clock signal, the input signal being a frequency-divided version of the reference clock signal and the digital code being an associated digital quantization error.

9. The apparatus, as recited in claim 1, wherein the digital-to-time converter is configured as a subrange data converter with respect to an integer frequency divider configured to generate the input signal and the digital code based on an input clock signal and a digital divider code.

10. The apparatus, as recited in claim 1, wherein the digital-to-time converter is configured to sample-and-hold the input signal in a time-to-digital signal converter.

11. The apparatus, as recited in claim 3, wherein the digital-to-time converter further comprises a voltage-to-current generator configured to generate the second reference signal, the voltage-to-current generator comprising a [switched capacitor] *switched-capacitor* resistor.

12. The apparatus, as recited in claim 1, wherein the digital-to-time converter is included in an output path of a clock synthesizer circuit.

13. The apparatus, as recited in claim 1, wherein the digital-to-time converter is included in a feedback loop of a phase-locked loop.

14. A method comprising:

establishing a first voltage level on a [first] node;

*generating an input signal and a digital code based on a reference clock signal and a digital divider code;*

*selecting a passive impedance according to the digital code;* changing a voltage on the [first] node from the first voltage level to a second voltage level [according to a digital code and] at a predetermined slew rate *using the passive impedance*, a switching threshold voltage level being between the first voltage level and the second voltage level; [and]

generating an output voltage signal based on a comparison of the voltage on the [first] node to the switching threshold voltage level, the output *voltage* signal having an edge delayed from a corresponding edge of [an] *the* input signal based on the digital code.

15. The method, as recited in claim 14, wherein establishing the first voltage level comprises selectively coupling the [first] node to a reset voltage having the first voltage level.

16. The method, as recited in claim 14, wherein changing the voltage comprises:

changing the voltage on the [first] node from the first voltage level to a second voltage level according to the digital code; and changing the voltage on the [first] node from the second voltage level to a third voltage level in response to the input signal.

17. The method, as recited in claim 14, wherein changing the voltage on the [first] node comprises:

generating a current by selectively opening and closing a switch coupled to a [switched capacitor] *switched-capacitor* resistor at a predetermined frequency.

[18. The method, as recited in claim 14, further comprising:

generating the input signal and the digital code based on a reference clock signal and a digital divider code.]

19. The method, as recited in claim 14, further comprising:

calibrating a gain of a digital-to-time delay conversion based on the output *voltage* signal and a delayed version of the input signal.

20. An apparatus comprising:

a comparator configured to generate an output signal based on *a comparison of* a first signal on a first node [and] *to* a reference signal on a second node; [and]

means for generating the first signal *using a passive impedance selected* according to a digital code and having a predetermined slew rate, *the first signal having a voltage level based on the passive impedance after a reset phase of a digital-to-time conversion and during a first phase of an input signal, the first signal slewing from the voltage level to a reference voltage level during a second phase of the input signal,* the output signal having an edge with an edge delay with respect to a corresponding edge of [an] *the* input signal, the edge delay being based on the digital code*; and*

*means for generating the input signal and the digital code based on a reference clock signal and a digital divider code.*

*21. The apparatus, as recited in claim 8, wherein the digital-to-analog signal converter comprises:*

*a plurality of elements configured to receive the digital code, the digital code having a plurality of bits, each of the plurality of elements comprising: an inverter configured to receive a corresponding bit of the plurality of bits; and a capacitor coupled in series between the inverter and the first node.*

* * * * *